United States Patent
Brodoceanu et al.

(10) Patent No.: US 11,579,182 B1
(45) Date of Patent: Feb. 14, 2023

(54) PROBE CARD FOR EFFICIENT SCREENING OF HIGHLY-SCALED MONOLITHIC SEMICONDUCTOR DEVICES

(71) Applicant: Facebook Technologies, LLC, Menlo Park, CA (US)

(72) Inventors: Daniel Brodoceanu, Cork (IE); Christopher Percival, Cork (IE); Zheng Sung Chio, Cork (IE); Chao Kai Tung, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 343 days.

(21) Appl. No.: 16/788,213

(22) Filed: Feb. 11, 2020

(51) Int. Cl.
| | |
|---|---|
| *G01R 31/27* | (2006.01) |
| *G01R 1/073* | (2006.01) |
| *G01R 31/26* | (2020.01) |
| *H01L 33/36* | (2010.01) |
| *H01L 21/66* | (2006.01) |
| *H01L 33/58* | (2010.01) |
| *F21V 8/00* | (2006.01) |
| *H01L 33/46* | (2010.01) |

(52) U.S. Cl.
CPC ......... *G01R 31/27* (2013.01); *G01R 1/07342* (2013.01); *G01R 31/2601* (2013.01); *G01R 31/2635* (2013.01); *H01L 22/20* (2013.01); *H01L 33/36* (2013.01); *G02B 6/0016* (2013.01); *G02B 6/0036* (2013.01); *H01L 33/46* (2013.01); *H01L 33/58* (2013.01); *H01L 2933/0033* (2013.01)

(58) Field of Classification Search
CPC ................ G01R 31/27; G01R 1/07342; G01R 31/2601; G01R 31/2635; H01L 22/20; H01L 33/36; H01L 33/46; H01L 33/58; H01L 2933/0033; G02B 6/0016; G02B 6/0036
See application file for complete search history.

(56) References Cited

U.S. PATENT DOCUMENTS

| | | | |
|---|---|---|---|
| 2002/0130676 A1* | 9/2002 | Beaman ............... | G01R 1/0735 324/755.08 |
| 2007/0132466 A1* | 6/2007 | Kister ................ | G01R 1/07371 324/756.03 |

(Continued)

*Primary Examiner* — Jonathan Han
(74) *Attorney, Agent, or Firm* — Shook, Hardy & Bacon LLP

(57) ABSTRACT

Enhanced probe cards, for testing unpackaged semiconductor die including numerous discrete devices (e.g., LEDs), are described. The die includes anodes and cathodes for the LEDs. Via a single touchdown event, the probe card may simultaneously operate each of the LEDs. The LEDs' optical output is measured and the performance of the die is characterized. The probe card includes a conductive first contact and another contact that are fabricated from a conformal sheet or film. Upon the touchdown event, the first contact makes contact with each of the die's anodes and the other contact makes contact with each of the die's cathodes. The vertical and sheet resistance of the contacts are sufficient such that the voltage drop across the vertical dimension of the contacts is approximately an order of magnitude greater than the operating voltage of the LEDs and current-sharing between adjacent LEDs is limited by the sheet resistance.

8 Claims, 16 Drawing Sheets

(56) References Cited

U.S. PATENT DOCUMENTS

| | | | |
|---|---|---|---|
| 2009/0183363 A1* | 7/2009 | Yamada | G01R 31/2891 29/825 |
| 2018/0259570 A1* | 9/2018 | Henley | H01L 33/36 |
| 2019/0170808 A1* | 6/2019 | Hsiang | G01R 31/2635 |
| 2019/0181122 A1* | 6/2019 | Hsu | H01L 33/62 |
| 2019/0189527 A1* | 6/2019 | Specht | G01R 31/2656 |

* cited by examiner

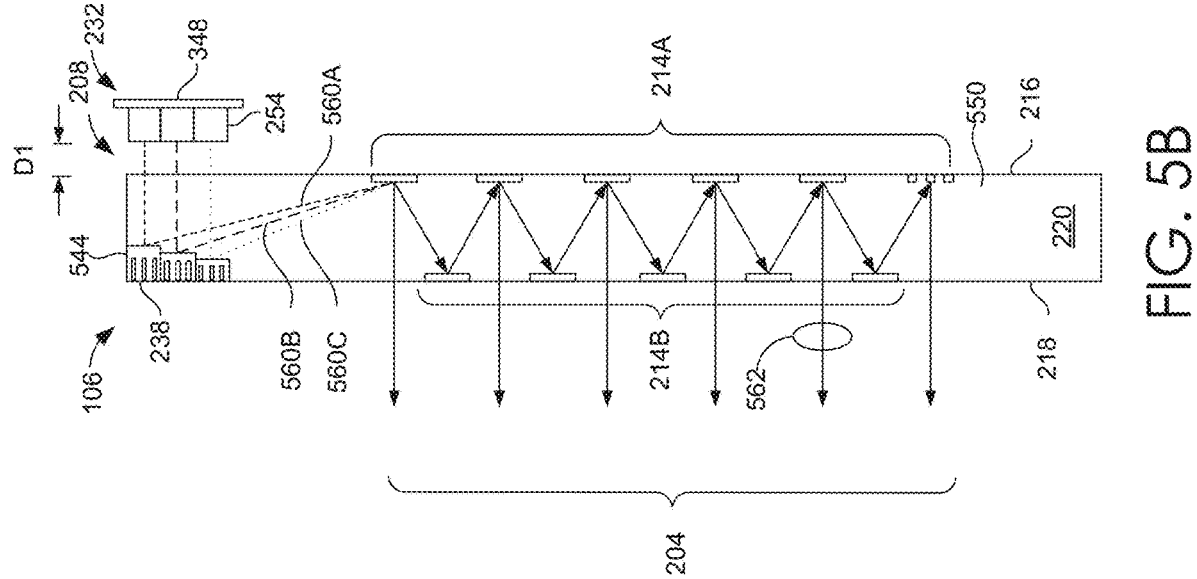

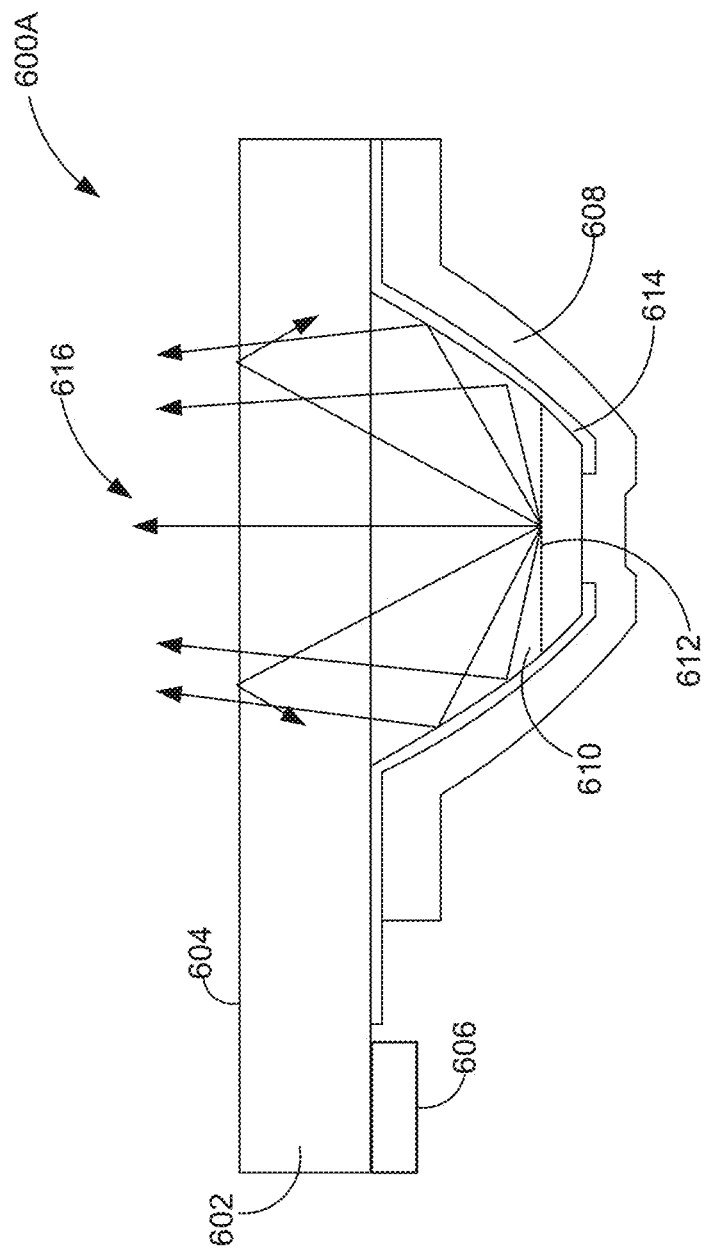

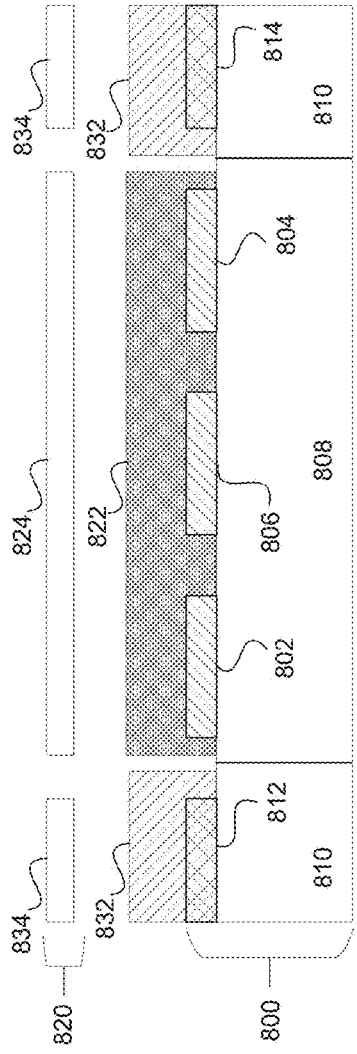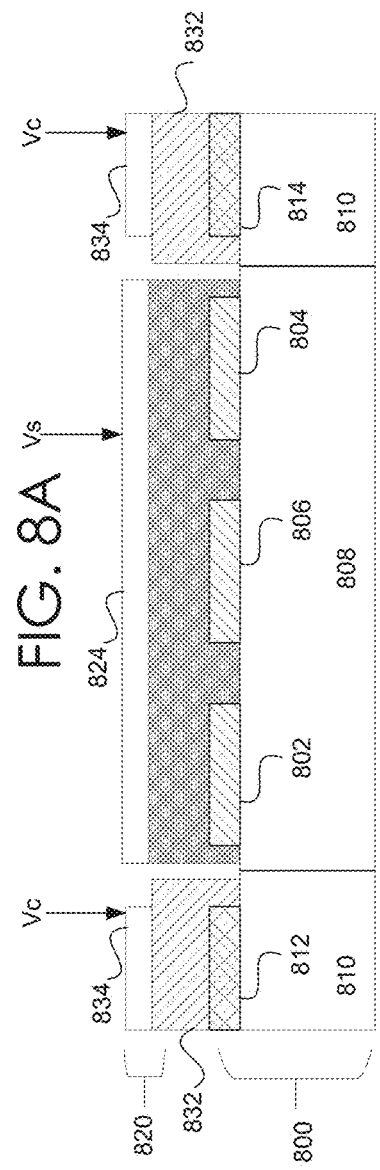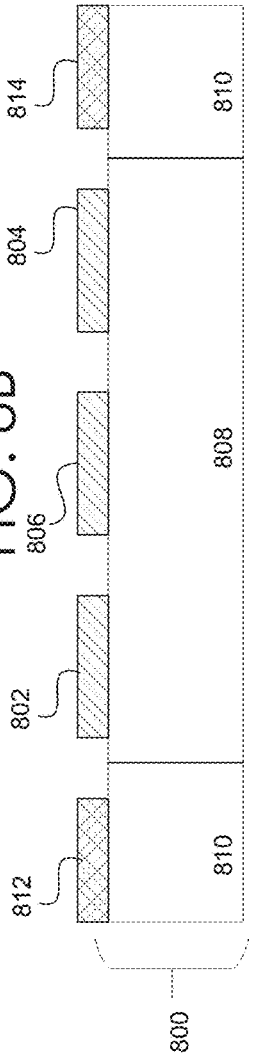

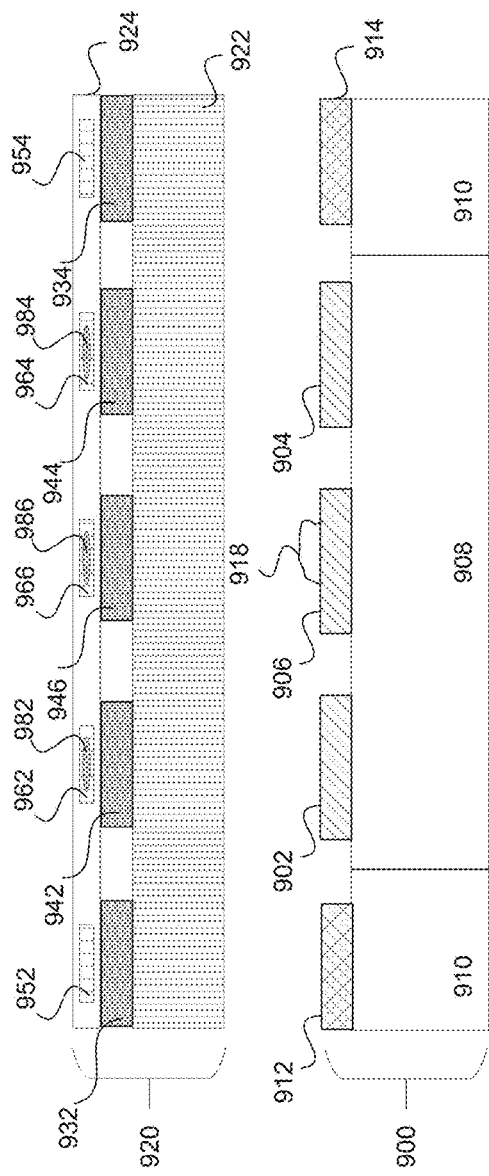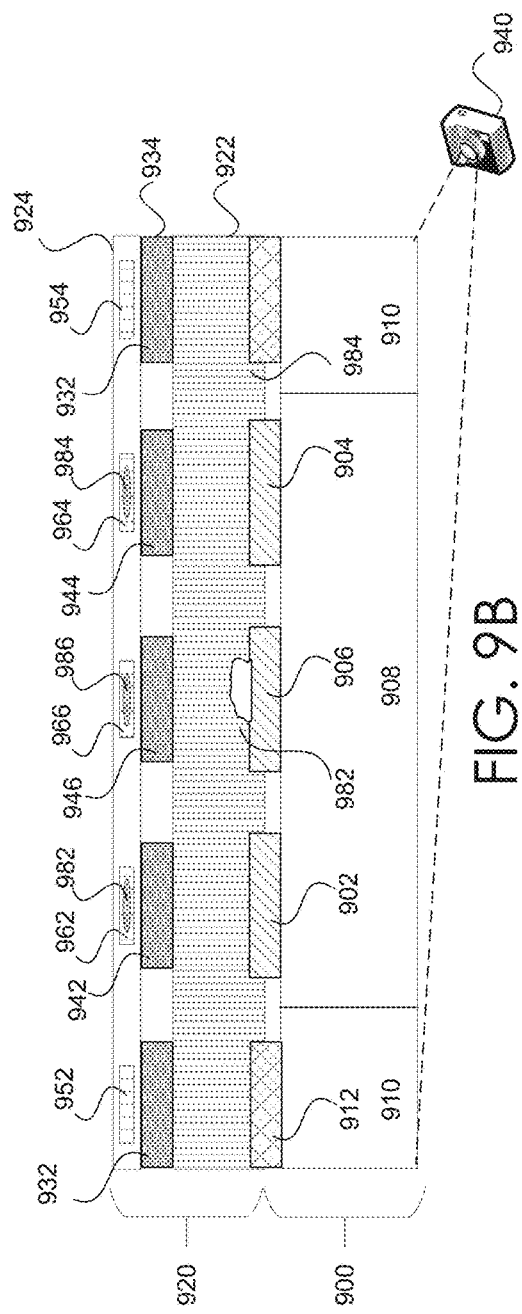

PROBE CARD FOR EFFICIENT SCREENING OF HIGHLY-SCALED MONOLITHIC SEMICONDUCTOR DEVICES

BACKGROUND

The present disclosure relates to the manufacture and assembly of electronic display devices.

Electronic displays are a core component of many computing devices, such as smart phones, tablets, smartwatches, laptops, desktops, televisions (TVs), and head-mounted devices (e.g., virtual reality (VR) devices, augmented reality (AR) devices, and/or mixed-reality (MR) devices). Near-eye displays (NEDs), such as those included in head-mounted devices, benefit from a sufficiently high definition (i.e., a significant pixel density), as well as fast refresh rates and high luminance levels.

SUMMARY

Embodiments of the present invention relate to enhanced probe cards employable to screen and/or test highly-scaled and integrated semiconductor devices, as well as characterize current and future fabrication processes of semiconductor foundries. The semiconductor device to be tested may be a monolithic and/or integrated device that includes a plurality of discrete semiconductor devices integrated on the monolithic semiconductor device. Each of the discrete semiconductor devices may include a cathode and anode pair, wherein a discrete semiconductor devices may be operated by applying a voltage difference across the corresponding cathode and anode pair. The monolithic semiconductor device to be tested may be referred to as a device under test (DUT). The DUT may be an unpackaged semiconductor die with exposed contact pads. The DUT may be a highly-scaled DUT that includes >$10^6$ discrete semiconductor devices with feature sizes on the order of a few microns, or less. In some non-limiting embodiments, the discrete semiconductor devices may include light-emitting diodes (LEDs) and/or micro LEDs (μLEDs). The feature size of the contacts pads may be submicron, with the pitch between adjacent contact pads being on the order of a few microns. The various embodiments of the enhanced probe cards are enabled to simultaneously test, screen, and/or operate each of the discrete semiconductor devices of the DUT, in a single "touchdown" event.

The enhanced probe cards include an electrically-conductive first contact. The first contact may include a conformal and/or elastic sheet and/or film. The embodiments include isotropic embodiments, where the electrical conductivity of the first contact is isotropic, and anisotropic embodiments, where the electrical conductivity of the first contact is anisotropic. As discussed throughout and due to the anisotropic conductivity of the first contact, the anisotropic embodiments may be enabled to individually address and sense the electrical current draw from each of the discrete semiconductor devices of the DUT. In contrast and due to the isotropic electrical conductivity of the first contact, the isotropic embodiments need not be enabled to individually and/or separately address each of the discrete semiconductor devices.

In anisotropic embodiments and upon a "touchdown" event with the DUT, the first contact of the probe card is configured and arranged to be in electrical contact with each of the anodes and cathodes of the DUT. Via the electrical contact between the anisotropic first contact and the anodes/cathodes of the DUT, and in order to perform testing and/or screening measurements for the DUT, the probe card may provide an input signal (e.g., a voltage difference) to each of the discrete semiconductor devices. Isotropic embodiments may include one or more other electrically-conductive and elastic/conformal contacts. The electrical conductivity of the one or more other contacts may be isotropic. In isotropic embodiments and upon the "touchdown" event with the DUT, the first contact of the probe card is configured and arranged to be in electrical contact with each of the anodes (or alternatively in contact with each of the cathodes) of the DUT and the one or more other contacts of the probe card is configured and arranged to be in electrical contact with each of the cathodes (or alternatively in contact with each of the anodes) of the DUT. Via the electrical contact between the isotropic first contact and the anodes of the DUT and the electrical contact between the one or more other contacts and the cathodes of the DUT, the probe card may provide an input signal to each of the discrete semiconductor devices.

The first contact (and the one or more other contacts of the isotropic embodiments) may be fabricated from a polymer sheet and/or film. The polymer may include but is not limited to polyimide (PI), polydimethylsiloxane (PDMS), polyurethane (PU), poly (3,4-ethylenedioxythiophene) polystyrene sulfonate (PEDOT:PSS), or the like. Because the film is a conformal and/or elastic film, the presence of particles or other debris on the surface of the contact pads for the anodes and/or cathodes of the DUT will not substantially decrease the probe card's ability to provide the input signal. Also, because the film is elastic, the screening measurements are substantially immune to variations in the size, shape, or height of the contact pads for the anodes and/or cathodes of the DUT. The anisotropic electrical conductivity of the anisotropic embodiments may be achieved via embedding conductive nanotubes and/or nanowires in a polymer matrix of the first contact. The polymer matrix may be substantially non-conductive, such that the electrical current on the first contact flows along the direction defined by the orientation of the conductive nanotubes and/or nanowires.

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein:

FIG. 5B illustrates a waveguide configuration of a display device that forms images and replications of images, in accordance with various embodiments;

FIG. 6A is a cross-sectional diagram illustrating an embodiment of an LED, in accordance with one embodiment;

FIGS. 8A-8C include diagrams illustrating a side view of a μLED die and another embodiment of an enhanced isotropic probe card that is consistent with the various embodiments described herein;

FIGS. 9A-9B include diagrams illustrating a side view of an integrated semiconductor device and an anisotropic enhanced probe card that is consistent with the various embodiments.

DETAILED DESCRIPTION

Figure 1A:
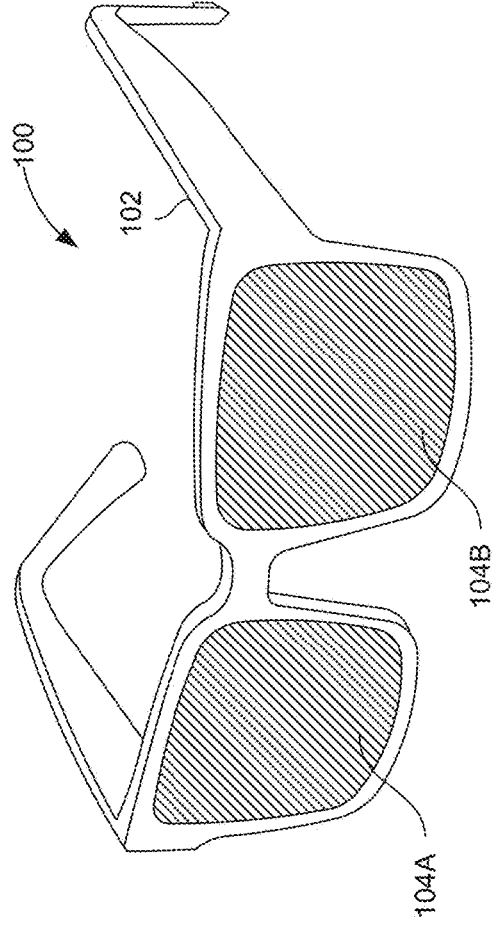
FIG. 1A is a diagram of a head-mounted device according to some embodiments.

In the semiconductor industry, the demand for smaller feature sizes and increased circuit density continues, and is expected to continue into the foreseeable future. That is, the push to increase the scaling of already highly-scaled semiconductor devices is expected to continue and likely accelerate. Monolithic integrated circuits (IC) chips may include millions or even billions of discrete devices (e.g., transistors, diodes, capacitors, floating gates, and the like) integrated on a single device. For example, a monolithic light-emitting device used to generate light for near-eye displays (NEDs) may include >$10^6$ individual light-emitting components (LECs) integrated on a single highly-scaled chip, with the feature size of features (e.g., contact pads) being submicron and inter-component pitches on the order of a few microns (μm). Micro light-emitting diodes (μLEDs) are a good candidate for the LECs for the display pixels in such NEDs, at least due in part to their small mass and feature size, as well as their low power requirements. That is, a highly-scaled monolithic μLED device, which may include hundreds of thousands or even millions of individual μLEDs, may be employed as a light source in a NED. When employed in a NED, each individual μLED of the monolithic μLED device may correspond to one or more individual display pixels in the NED.

Prior to utilizing a monolithic μLED device as a light source within a NED, the μLED device may be screened to characterize the performance of each individual (i.e., discrete) μLED on the monolithic μLED device. That is, the light output (e.g., luminosity as a function of the voltage difference applied across the anode and cathode) of each individual μLED may be measured to determine if the monolithic μLED device has any "bad pixels." μLED devices where the light output from all the individual μLEDs (or at least a thresholded fraction of the total number of discrete μLEDs) is acceptable for use in a NED may be referred to as a "Known Good Device," a "Known Good Die," or simply a KGD. Only μLED devices which are determined to be a KGD may be employed in the assembly of a NED.

To avoid the cost and time associated with packaging devices that are "bad devices" (e.g., those devices that are not KGD), the screening may be performed on the μLED die, prior to packaging the die. That is, prior to packaging (e.g., electrically bonding a μLED die to a backplane for the μLED device), each individual μLED die on a wafer may screened to determine which die on the wafer are KGD and which die do not pass the screening process. Only the die corresponding to KGD may be packaged (e.g., electrically bonded to a backplane device). To screen a μLED die, the individual μLEDs may be tested (e.g., probed with an input signal and the corresponding light output is observed) to determine if the performance of the each of the individual μLEDs (or at least a thresholded fraction of the μLEDs) is acceptable for the employment in a NED.

On a μLED die, the individual electrical contacts (e.g., contact pads for cathodes and anodes) for the individual μLEDs may be exposed. To screen monolithic μLED devices, each of the individual μLEDs may be activated and/or "turned on" via an input signal applied to the exposed contact pads (e.g., a voltage difference may be applied to the anode and cathode of an individual μLED). When the individual μLEDs are activated, the response (e.g., the optical output) of each of the individual μLEDs may be measured (e.g., by imaging the luminosity of the outputted light).

Because of the large number of discrete μLEDs (e.g., >$10^6$) on a single μLED device, it is desirable to probe each of the individual μLEDs in a single "touchdown" event of a probe card that is enabled to provide the input signal to pairs of corresponding anodes and cathodes for each of the individual μLEDs. In addition to electrically contacting each individual μLED, it is desirable to simultaneously probe (e.g., provide the input signal to) each individual μLED on the die and simultaneously measure the responsive output signal (e.g., simultaneously image the light output from each of the individual μLEDs). As discussed below, due to the highly scaled nature of such monolithic μLED devices (e.g., the large number of individual μLEDs and the small feature sizes of the individual μLEDs), conventional probe cards may not be enabled to simultaneously contact the contact pads for each of the individual μLEDs on a single die and/or may not be enabled to provide the input signal to each of individual μLEDs, via a single "touchdown" event. To such ends, the various embodiments provide enhanced probe cards that are enabled to simultaneously contact each of the contacts pads for each of the individual μLEDs on a single die, as well as simultaneously provide the input signal to each of the individual μLEDs, via a single "touchdown" event.

In addition to being able to simultaneously screen each individual μLED on a monolithic μLED device via a single "touchdown" event, the various embodiments of enhanced probe cards are employable to characterize a semiconductor foundry's fabrication process. In particular, a μLED's fabrication process may be characterized by acquiring statistics indicating the electrical and optical properties of the μLED fabricated from the process (e.g., determining the percentage of KGDs relative to the total number of μLED die fabricated by the particular fabrication process). That is, post-fabrication but prior to packaging the μLED and assembling the NED, the electrical and light-emitting properties of a statistically significant sample of μLED die from the same fabrication process may be tested via the various embodiments of enhanced probe cards provided herein. Similar to screening individual die, to characterize the fabrication process, the contact pads of the die are exposed for probing and the test data is typically acquired from electrical and optical tests performed at the wafer level. To test and/or screen an individual die (e.g., perform electrical and/or optical measurements on individual μLEDs integrated on the die), the die is electrically probed, via the exposed contact pads for each of the individual μLEDs. These electrical and optical measurements may be employed to generate statistical distributions that characterize the process used for fabricating the μLEDs.

As noted above, for a μLED device utilized in a NED, the die may include upwards of a million individual μLEDs. As discussed throughout, the individual μLEDs may be arranged in 1D or 2D arrays. The pitch of the exposed contact pads may be less than 5 microns (μm), while the feature size of the contact pads may be submicron. To screen individual die and/or characterize a fabrication process, the small feature size and high-density of the contact pads presents challenges that limit the ability to accurately, efficiently, reliably, and within a reasonable timeframe, probe the individual μLEDs of the die via conventional techniques and hardware. As discussed throughout, conventional architectures for probe cards cannot accommodate such highly-scaled and monolithic μLED devices. Thus, conventional probe cards are not adequate to properly and efficiently screen die and/or characterize current fabrication processes, much less the more highly-scaled fabrication processes of the expected future.

To address such inadequacies of conventional probe cards, the embodiments disclosed herein are directed towards enhanced probe cards that overcome these and other limitations of conventional probe cards. The enhanced probe cards may include a single electrically-conductive first contact than can simultaneously (and in parallel) electrically contact the anode (or conversely the cathode) of each of the individual μLEDs on a die. The enhanced probe card may include one or more other electrically-conductive contacts that can simultaneously (and in parallel) electrically contact the cathode (or conversely the anode) of each of the individual μLEDs on the die. An input signal may be simultaneously applied to each of the individual and discrete μLEDs. For example, a parallel voltage may be applied across the anodes and cathodes via the first contact (which is in simultaneous contact with the anodes of each of the individual μLEDs) and the one or more other contacts (which are in simultaneous contact with the anodes of each of the individual μLEDs). The output signals, in response to the parallel input signal, from each of the individual μLEDs may be observed. For instance, the light output from each of the individual μLEDs may be imaged via one or more camera devices.

The first contact may include and/or be fabricated from a conformal and/or elastic film (e.g., a polymer sheet). The elastic film and/or sheet may be an electrically-conductive film and/or sheet that is characterized by a "vertical" electrical resistance and a "horizontal" electrical resistance. The vertical resistance may be a resistance and/or impedance to the flow of electrical current in the spatial direction that is defined via the "thickness" of the sheet and/or film. The axis along which the thickness of the film is measured may define a vertical direction and/or axis for the film. The horizontal resistance may be a resistance and/or impedance to the flow of electrical current in one or more spatial directions that are orthogonal to the vertical direction of the sheet and/or film. The one or more axes that are orthogonal to the vertical direction of the film may define one or more horizontal directions and/or axes for the film. The horizontal resistance of the first contact may be referred to the "sheet" resistance of the first contact.

The one or more other contacts of the probe card may be similar to the first contacts, in that the one or more other contacts may include and/or be fabricated from a conformal and/or elastic film and/or sheet that is electrically conductive. Thus, the one or more other contacts may be characterized by a vertical resistance and a horizontal (or sheet) resistance. Prior to a touchdown with an integrated and/or monolithic μLED device (or any other semiconductor device to be tested and/or screened with the enhanced probe card), the first contact and the one or more other contacts of the probe card may be electrically isolated from one another. The touchdown event with the μLED device (or the other semiconductor device) completes an electrical circuit between the first contact and the one or more other contacts, such that upon a touchdown event, the first contact and the one or more other contacts are not electrically isolated. At least one of the discrete μLEDs of the monolithic μLED device (or another discrete device of another semiconductor device to be tested) may act as a circuit element of the completed circuit between the first contact and the one or more other contacts.

In some embodiments, the electrical-conductivity of the first contact (and the one or more other contacts) may be isotropic with respect to the vertical and the horizontal directions. In other embodiments, the electrical-conductivity of the first contact (and the one or more other contacts) may be anisotropic with respect to the vertical and the horizontal directions. In such anisotropic embodiments, the horizontal (or sheet) resistance may be significantly larger than the vertical resistance, such that the horizontal resistance may be, for practical purposes, considered as an infinite resistance and/or the horizontal conductivity may be considered to be close to zero). That is, in anisotropic embodiments, very little, if any electrical current may flow in the one or more horizontal directions. In contrast, in isotropic embodiments, each of the vertical resistance and the horizontal resistance of the first contact (and the one or more other contacts) may be non-zero and finite. That is, in the isotropic embodiments, some amount of electrical current may flow in the one or more horizontal directions. However, as discussed below and in isotropic embodiments, the horizontal current may be limited by the horizontal (or sheet) resistance. Thus, in isotropic embodiments, the horizontal current may be non-zero but limited via the horizontal resistance, while in anisotropic embodiments, the horizontal current may be considered close to zero. The vertical current in each of the isotropic and anisotropic embodiments may be non-zero but limited due to the finite vertical resistance. As discussed in conjunction with at least FIGS. 9A-9B, each of the discrete μLEDs of the monolithic μLED device may be individually addressed and operated. Furthermore, the electrical current drawn by each of the discrete μLEDs may be individually measured and/or sensed in the anisotropic embodiments. In contrast and as discussed in conjunction with at least FIGS. 7A-8C, in the isotropic embodiments, each of the discrete μLEDs may not be individually addressed and the current drawn by each of the discrete μLEDs may not generally be measured and/or sensed (with the exception of the light generated by each μLED connected via the isotropic conductive polymer electrode).

The elastic film of the first contact film of an isotropic embodiment may be isotropically electrically-conductive and coat an isotropically electrically-conductive planar surface (e.g., a metallic plane) that includes a continuous electrode that is common to all the anodes (or conversely the cathodes) of the μLED die. The film (or sheet) may have substantially uniform resistance such that the electrical current and/or voltage is provided in parallel via electrically-conductive layer and shared amongst the individual μLEDs. Because the current and/or voltage is shared amongst the individual μLEDs, variations in the internal resistance of the μLEDs across the die do not significantly impact the current drawn of any particular μLED. Thus, even in the presence of significant variance in the internal resistance of the μLEDs, the light output of the individual μLEDs does not significantly vary across the die. As discussed below, because the resistance (e.g., both the "vertical" and the "sheet" resistance) of the film is significantly greater (e.g., by an order of magnitude) than the average or mean resistance of the individual μLEDs, μLEDs that include an "open" or a "short" circuit will not significantly affect the current drawn by neighboring μLEDs. Additionally, because the film is a conformal and/or elastic film, the presence of particles or other debris on the surface of the contact pads for the anodes and/or cathodes will not substantially decrease the first contact's ability to provide the input signal. Also, because the film is elastic, the screening measurements are substantially immune to variations in the size, shape, or height of the contact pads for the anodes and/or cathodes of the μLEDs.

Thus, the various embodiments provide an enhanced probe card that enables all of (or at least a significant portion of) the individual μLEDs integrated on a monolithic μLED device to be electrically contacted via a single "touchdown" event of the probe card. The probe card is enabled to provide a parallel (and thus common) supply voltage across the anodes (and/or cathodes) of the μLED device. Although adjacent discrete μLEDs may share from the current source of the first contact, due to the relative high-resistance of the first contact, the current is not freely-shared in a similar way that other parallel-connected devices are. The relative vertical and sheet resistance of the film partially "isolates" each parallel "branch" of the circuit formed by the common first contact and the individual μLEDs. Thus, μLEDs with short or open circuits will not substantially affect the amount of current drawn by neighboring μLEDs. Accordingly, the variance in current drawn by the μLEDs (except those that may include a short or open circuit) will be relatively small (e.g., +10%). Accordingly, the observation of the light output for the μLEDs will be relatively representative of the external quantum efficiency (EQE) of the individual μLEDs.

Because each of the μLEDs may be simultaneously activated or "turned on" (due to being able to contact each μLED via a single "touchdown event"), each of the μLEDs may be imaged via a single imaging device (e.g., a camera or a colorimeter), calibrated for the average or mean luminosity and/or brightness of the μLEDs. The EQE of each individual μLED may be determined based on observing the output signals (e.g., by analyzing the luminosity of the μLEDs in the image of the μLED light output). The image of the light output may be employed in a "pass/fail" test for the μLED die. In some embodiments, the electrically-conductive film may be applied to a continuous electrode, which may be translated (e.g., for a "touchdown" event of the probe card) to make a simultaneous and/or parallel contact with each of the anodes. In such embodiments, the electrically-conductive film may be re-employed for the screening of multiple μLED die. In other embodiments, the film may be directly applied to the μLED die, such that the film covers the anodes (or conversely the cathodes). To supply the input voltage, the continuous electrode may be translated to electrically contact the conformal film (or coating) that covers the die. In such embodiments, if the die passes the screening test (i.e., it is determined that the die is a KGD), then the film may be removed from the die prior to packaging the die.

Conventional probe cards cannot achieve these and other benefits of the enhanced probe cards discussed herein. For example, conventional probe cards may not be able to contact all of the μLEDs of a 1D or 2D array embedded on a die in a single "touchdown" event. Thus, conventional probe cards may require more than one "touchdown" of the probe card (and thus significantly more time) for a screen process and/or "pass/fail" test on die. Additionally, conventional probe cards may damage the exposed contact pads on a die. Because the first contact of the enhanced probe cards includes a conformal film that physically contacts the contact pads, the enhanced probe cards discussed herein are less likely to damage the contact pads during a "touchdown" event.

Exemplary Embodiment of a Head-Mounted Computing Device

Light-emitting components (e.g., micro light-emitting diodes) may be used in a near-eye display (NED) device included in a head-mounted device (HMD). As such, various embodiments, various embodiments of NEDs and HMDs will now be discussed. FIG. 1A is a diagram of a HMD 100 according to some embodiments. HMD 100 is one example embodiment of a head-mounted computing device. As such, HMD 100 may include a near-eye display (NED), which may include one or more display devices. The depicted embodiment includes a left display device 104A and a right display device 104B, which may be collectively referred to as the display device 104. The display device 104 may present content to a user. Examples of content presented by display device 104 may include, but are not limited to, one or more images, a series of images (e.g., a video), virtual objects, audio, or some combination thereof. As discussed throughout, display device 104 may include one or more arrays of light-emitting components, such as but not limited to one-dimensional (1D) or two-dimensional (2D) arrays of light-emitting diodes (LEDs). The light-emitting components may be affixed or bonded to a backplane of the display device 104.

In some embodiments, audio content may be presented via an audio device (e.g., speakers and/or headphones) of HMD 100. The audio device may receive audio content or information from the display device 104, a controller or processing unit of the HMD 100 (not shown), or an external device. The display device 104 may generally be configured to operate as an augmented-reality (AR) NED, such that a user can simultaneously view content projected (or otherwise presented) by the display device 104, and their real-world environment through the display device 104. In such embodiments, the display device 104 may augment views of a physical, tangible, and real-world environment with computer-generated (or virtual) elements (e.g., content including images, video, sound, and the like). However, in some embodiments, the display device 104 may be modified to additionally, or in the alternative, operate as a virtual-reality (VR) NED, a mixed-reality (MR) NED, or some combination thereof.

In addition to display device 104, HMD 100 may include a support or frame 102 that secures the display devices 104 in place on the head of a user. In some embodiments, the frame 102 may be a frame of eyewear glasses. HMD 100 may include at least one of a controller or a processing unit (e.g., a central processing unit, microcontroller, or microprocessor), a non-transitory, computer-readable storage device (e.g., volatile or non-volatile memory devices), and a communication transceiver (e.g., a wireless and/or wired network adaptor). As described herein in conjunction with some exemplary embodiments, the display device 104 may include a waveguide and holographic and/or volumetric Bragg gratings. The gratings may be generated by a process of applying one or more dopants or photosensitive media to predetermined portions of the surface of the waveguide, and subsequent exposure to ultraviolet (UV) light or other activating electromagnetic (EM) radiation. The various operations and/or functionalities of HMD 100 may be controlled via executing instructions on a processor device and/or controller device. When the instructions are executed, the processor device and/or controller device may cause the performance of various actions and/or steps. The instructions may be stored on a non-transitory computer-readable storage medium.

Figure 1B:
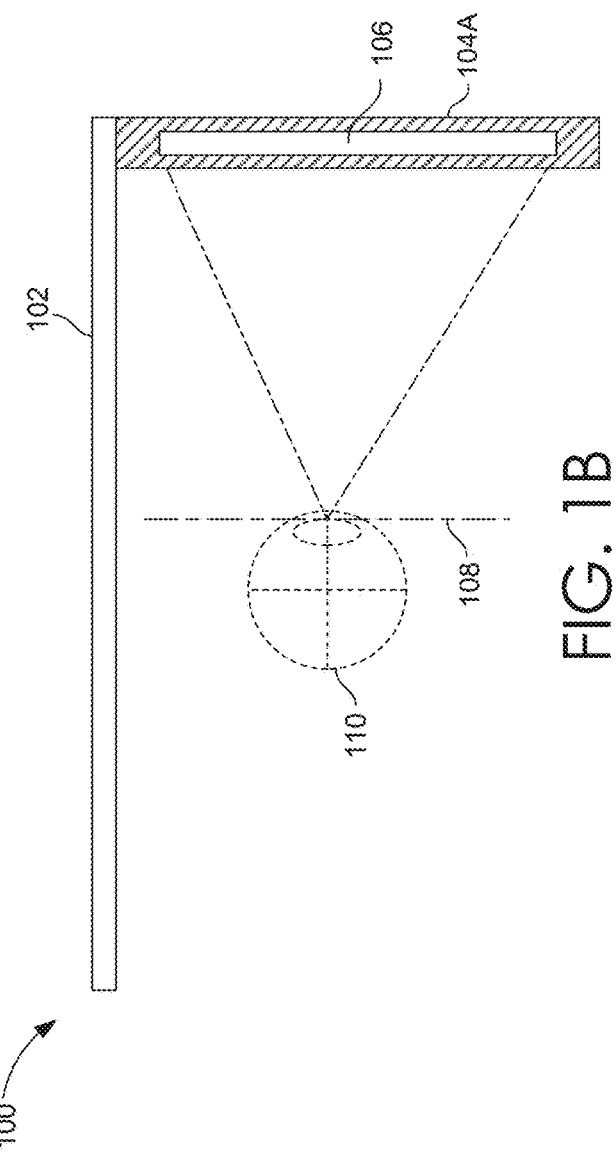
FIG. 1B illustrates a cross-sectional view of a portion of the head-mounted device of FIG. 1A, in accordance with some embodiments.

FIG. 1B illustrates a cross-sectional view of a portion of HMD 100, as shown in FIG. 1A, in accordance with some embodiments. The portion of the HMD 100 shown in FIG. 1B is associated with a single eye 110 of a user. The display device 104A may include at least one waveguide configuration 106. FIG. 1B shows an eye-box 108, which may be a location where the user's eye 110 is positioned when the user wears the HMD 100. When the eye 110 is aligned with the eye-box 108, the user may be visually provided a projected image, via the waveguide configuration 106. Waveguide configuration 106 directs the projected image towards the eye-box 108. The waveguide configuration 106 may receive and direct multiple pupil replications (i.e., replications of an image) towards the eye-box 108. For purposes of illustration, FIG. 1B shows a cross-section associated with a single eye 110 of the user and a single waveguide configuration 106. In some alternative embodiments, another waveguide configuration (which may be separate from the waveguide configuration 106 shown in FIG. 1B) may provide image light to another eye-box located with the other eye of the user, e.g., a waveguide configuration included in each of display devices 104A-104B of FIG. 1A.

The waveguide configuration 106, as illustrated in FIG. 1B, may be configured to direct image light (i.e., light that forms an image) to eye-box 108, which is positioned proximate the eye 110. The waveguide configuration 106 may be composed of one or more optical materials (e.g., plastic, glass, and the like) with one or more refractive indices that effectively minimize weight and widen a field-of-view (FOV) of the display device 104A. In alternative embodiments, the display device 104A may include one or more optical elements between the waveguide configuration 106 and the eye 110. The optical elements may act to manipulate light emitted from the display device 104A (e.g., image light emitted from display device 104A), perform one or more other optical adjustments to the light, or some combination thereof. Non-limiting examples of optical elements include an aperture, a Fresnel lens, a refractive (e.g., convex and/or convex) lens, a reflective surface, a filter, or any other suitable optical elements that manipulates light. Although not shown in FIG. 1B, the waveguide configuration 106 may include a waveguide with one or more sets of Bragg gratings.

In some embodiments, in order to achieve desired optical specifications or criteria, such as but not limited to a desired viewing angle, a maximum aperture size, a desired resolution, a minimum distortion level, a color correction, a back focal distance, and the like, the lenses (and other optical elements) described herein may include various designs. The lens or lenses may include a cylindrical lens, an anamorphic lens, a Fresnel lens, a gradient index lens, and the like. The lens may include a super lens, at least a portion of which having a negative index of refraction. The lens may include multiple lenses having various shapes. In some embodiments, the lens or lenses may include various optical materials. For example, a lens may include glass. In another non-limiting example embodiment, a lens can include a plastic material, such as but not limited to a CR-39 lens material, a urethane-based polymer, or a polycarbonate material.

Figure 2A:
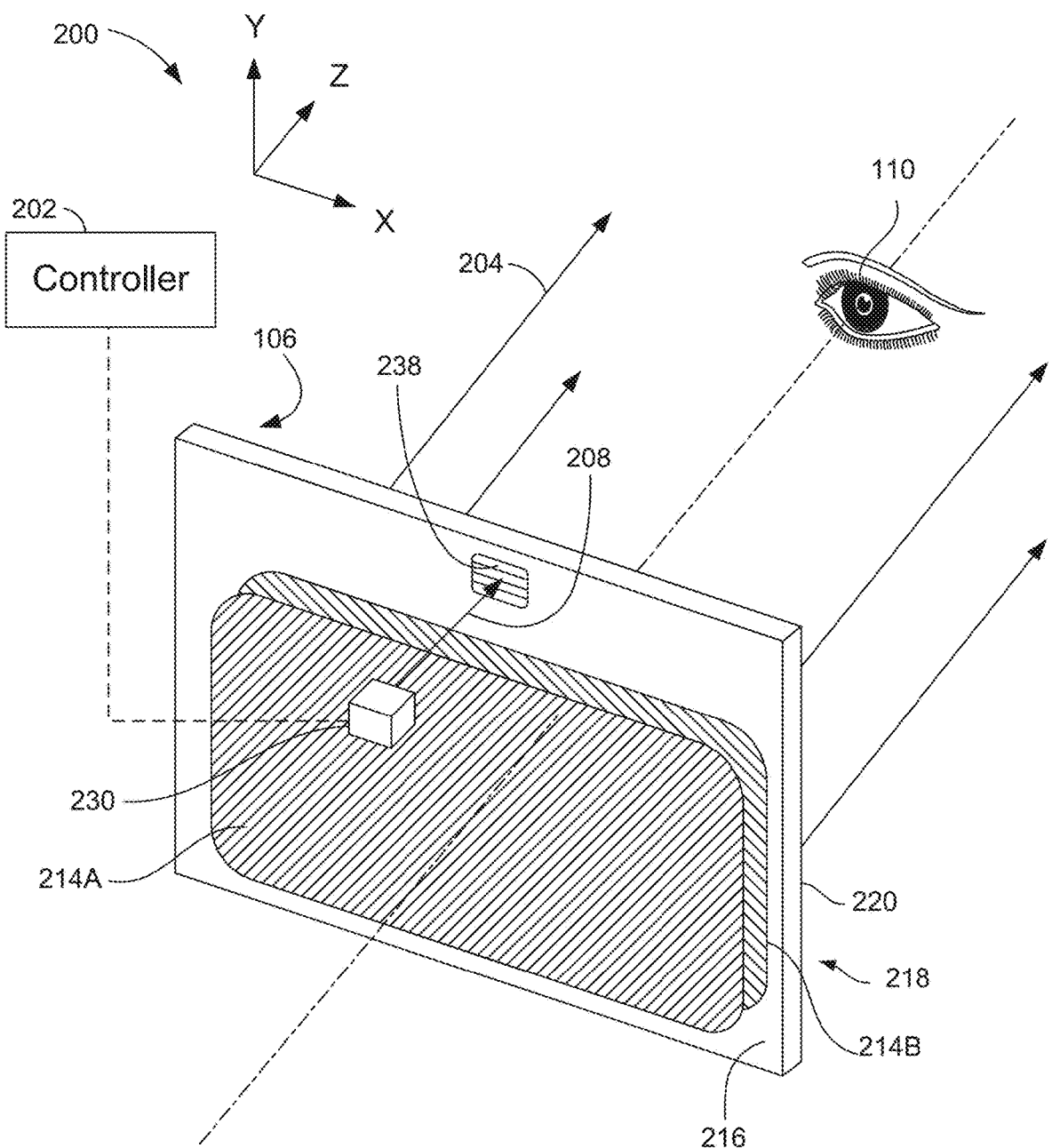
FIG. 2A illustrates an isometric view of an embodiment of a display device that is included in a head-mounted device.

FIG. 2A illustrates an isometric view of an embodiment of a display device 200 that is included in a head-mounted device. The various operations and/or functionalities of display device 200 may be controlled via executing instructions on a processor device and/or controller device. When the instructions are executed, the processor device and/or controller device may cause the performance of various actions and/or steps. The instructions may be stored on a non-transitory computer-readable storage medium.

Display device 200 may be included in HMD 100 of FIGS. 1A-1B. As such, display device 200 may be an embodiment of (or at least be similar to) display devices 104A-104B of FIGS. 1A-1B. In addition to the components discussed in conjunction with FIGS. 1A-1B, display device 200, or other components of HMD 100, may include source assembly 230, waveguide configuration 106, and controller 202. Waveguide configuration 106 may include at least a waveguide 220, a coupling element 238 a first (or top) decoupling element 214A, and a second (or bottom) decoupling element 214B. Waveguide 220 may include a top surface 216 and a bottom surface 218.

As shown in FIG. 2A, the bottom surface 218 of waveguide 220 and the second decoupling element 214B are facing the user's eye 110, while the top surface 216 of waveguide 220 and the first decoupling element 214A are facing towards the user's field-of-view (FOV) of the user's environment. Thus, the bottom surface 218 may be referred to as the user's surface of waveguide 220 and the second decoupling element 214B may be referred to as the user's decoupling element. In contrast, the top surface 216 may be referred to as the environment's surface of waveguide 220 and the first decoupling element 214A may be referred to as the environment's decoupling element. As discussed throughout, second decoupling element 214B outputs post-waveguide image light 204 to the user's eye 110. Thus, second decoupling element 214B may be referred to as the output decoupling element. As discussed in conjunction with FIGS. 2B-2C, source assembly 230 may include a light source and/or an optics system. In at least one embodiment, source assembly 230 may be referred to as a projector device, or simply a projector. Source assembly 230 may be an embodiment of (or at least be similar to) source assembly 230 of FIG. 2C.

Controller 202 may be an example of a central processing device (CPU), graphics processing unit (GPU), microcontroller, microprocessor, or some other logic-executing device, e.g., a field-programmable gate array (FPGA) or an application-specific integrated circuit (ASIC). Similar to FIG. 1B, display device 200 of FIG. 2A is associated with a single eye 110 of a user. As discussed in conjunction with FIG. 1A, another display device including HMD 100 may provide image light to the user's other eye. In some embodiments, one or more components of HMD 100 may be shared between the separate display devices for each eye. In still other embodiments, the single waveguide configuration 106 or display device 200 may provide post-waveguide image light 204 to both of the user's eyes. Waveguide 220 may be one of one or more waveguides included in waveguide configuration 106. Although only a single waveguide is shown in FIG. 2A, waveguide configuration 106 may include additional waveguides.

The source assembly 230 may generate pre-waveguide image light 208 that enters waveguide configuration 106, is transmitted via waveguide 220, and exits waveguide configuration 106, as post-waveguide image light 204. As used herein, prior to entering waveguide configuration 106, via coupling element 238, the image light may be referred to as pre-waveguide image light 208. After the transmitted image light exits waveguide configuration 106, via second decoupling element 214B, the image light may be referred to as post-waveguide image light 204. The pre-waveguide image light 208 may form one or more two-dimensional (2D) monochromatic or multi-chromatic images. The one or more images may be received by waveguide, via coupling element 238. The one or more images may be transmitted through waveguide 220 and outputted towards the user's eye 110, via waveguide 220 second decoupling element 214B. The post-waveguide image light 204 may provide the transmitted one or more 2D images to user's eye 110. In various embodiments, waveguide 220 is an output waveguide, because it outputs image light that is directed towards and received by the user's eye 110.

Figure 2B:
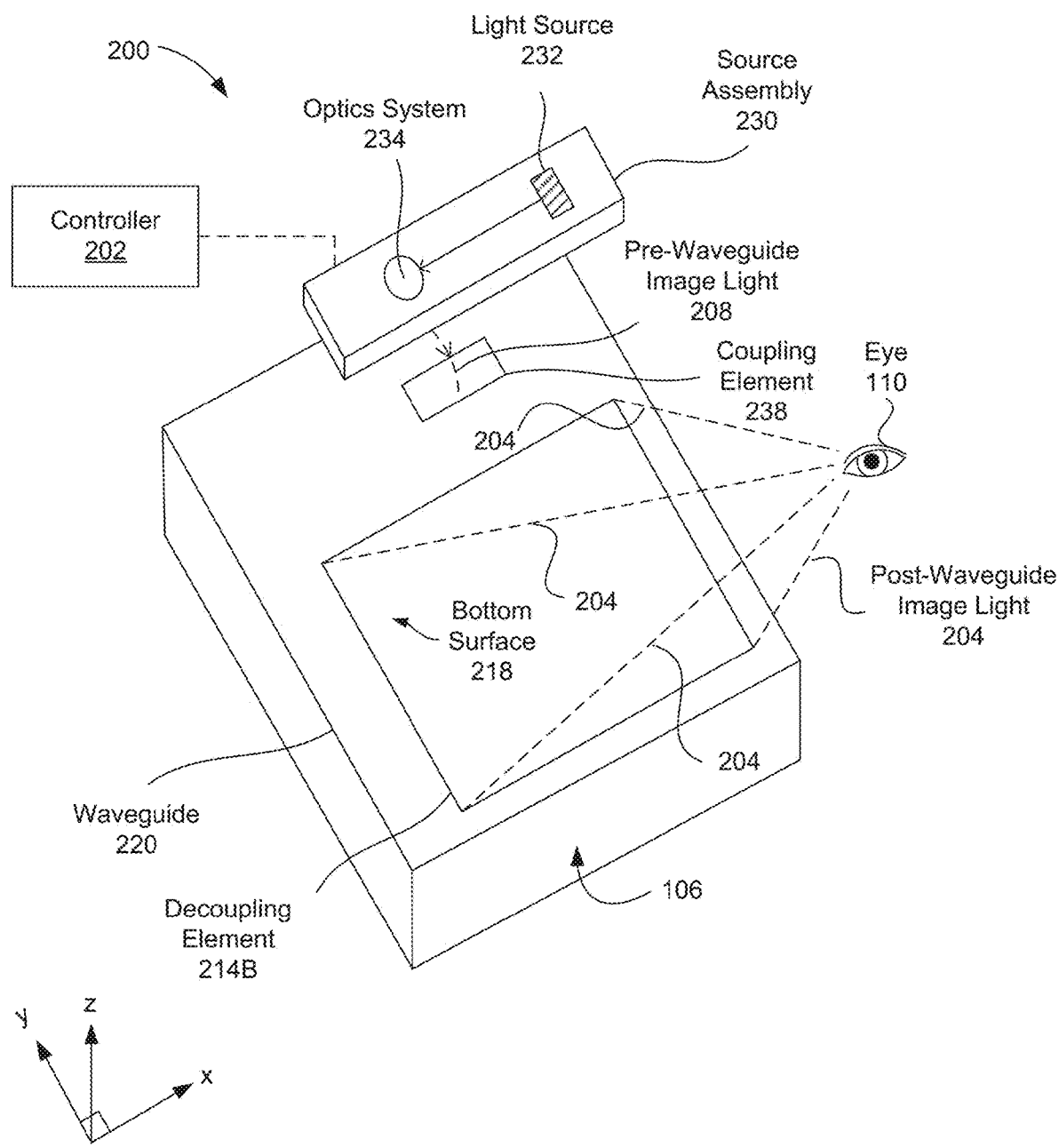
FIG. 2B illustrates a perspective view of another embodiment of a display device that is included in a head-mounted device.
Figure 2C:
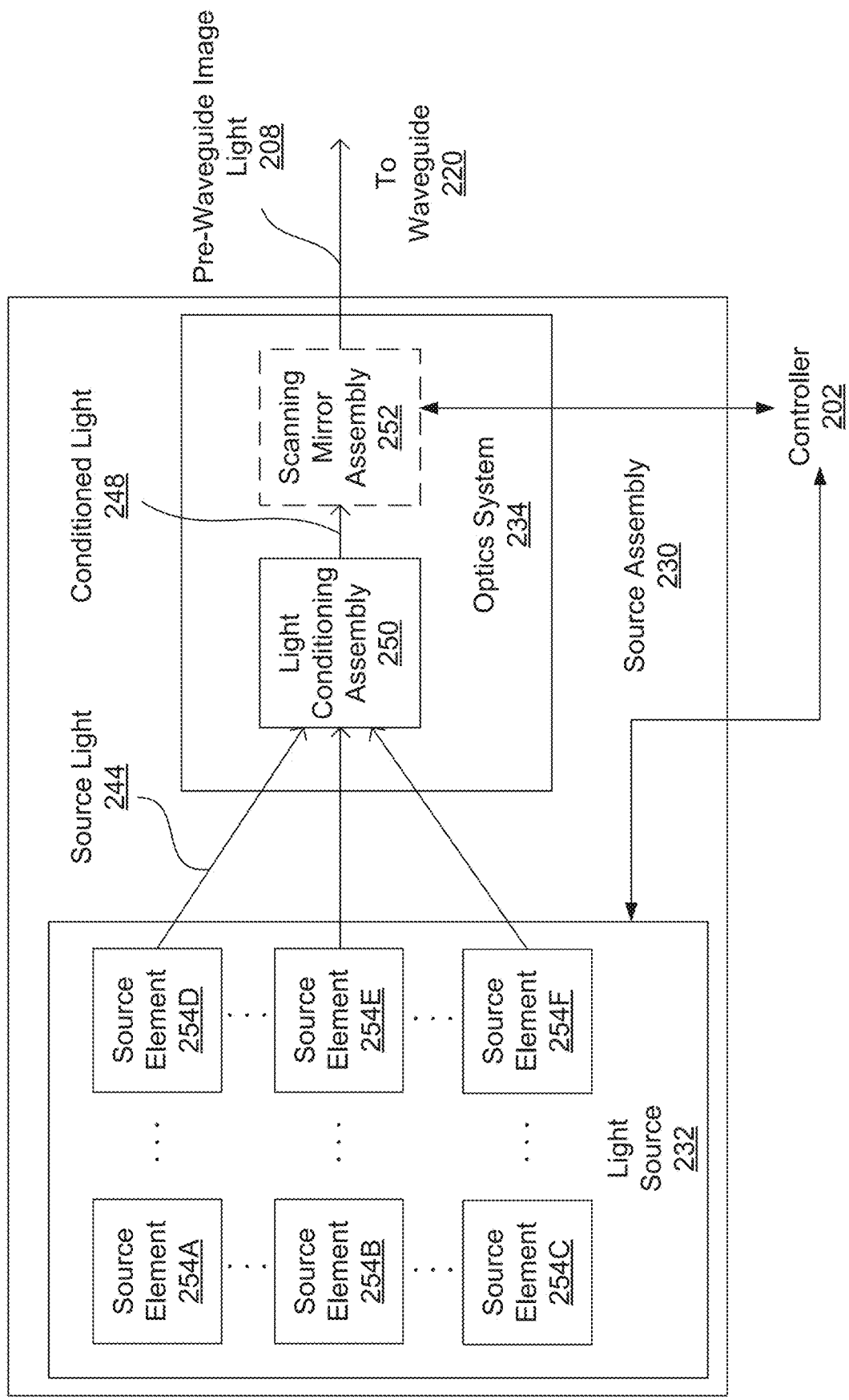
FIG. 2C illustrates a block diagram of the source assembly of FIGS. 2A-2B, in accordance with various embodiment.

Various embodiments of source assembly 230 are described in conjunction with at least FIGS. 2B-2C. As shown in FIGS. 2B-2C, source assembly 230 may include one or more 1D or 2D monochromatic or multi-chromatic light sources and an optics system. Various embodiments of light sources and optics systems are described in conjunction with at least FIGS. 2B-2C, 3, and 4. However, briefly here, light source (e.g., light source 232 of FIG. 2B-2C) may generate the pre-waveguide image light 208. The light source may include arrays (e.g., emitter arrays) of monochromatic or multi-chromatic light-emitting components (e.g., LEDs) which generate image light. The light-emitting components may be bonded to a backplane of source assembly 230. The light source may generate source light and the optics system may condition the source light to project the pre-waveguide image light 208 towards coupling element 238 located on the top surface 216 of the waveguide 220. The projected pre-waveguide image light 208 may include 2D image light that forms one or more 2D images.

In at least some embodiments, an optics system of the source assembly 230 may include a scanning mirror assembly that includes a scanning mirror that scans the generated pre-waveguide image light 208. The scan patterns of the scanning mirror assembly are such that the scanned pre-waveguide image light 208 forms the one or more 2D images. Such non-limiting embodiments may be referred to as scanning embodiments. The pre-waveguide image light 208 may propagate along a dimension or direction towards the coupling element 238, where the pre-waveguide image light 208 is received by and/or coupled to waveguide 220.

The waveguide 220 may be an optical waveguide that outputs 2D images, via 2D post-waveguide image light 204 that is directed to the eye 110 of the user. The waveguide 220 may receive pre-waveguide image light 208, projected via source assembly 230, at coupling element 238. The coupling element 238 may include one or more coupling elements located on the top surface 216 and/or within the body of waveguide 220. Coupling element 238 may guide and/or couple the received pre-waveguide image light 208 to a propagation area of the waveguide 220. Coupling element 238 may include a diffraction grating, a holographic grating, one or more cascaded reflectors, one or more prismatic surface elements, an array of holographic reflectors, a metamaterial surface, or some combination thereof. An exemplary, but non-limiting, embodiment of the coupling element 238 may include a grating having a pitch of approximately 300 nm to approximately 600 nm. The coupling element 238 may be understood as extending from the top surface 216 to the bottom surface 218 of the waveguide 220. The coupling element 238 may redirect received pre-waveguide image light 208, according to a first grating vector, into the propagation area of the waveguide 220. Waveguide 220 may be included in and/or formed in the body of waveguide configuration 106. Waveguide 220 may be positioned between the first and second decoupling elements 214A-214B.

The first decoupling element 214A may redirect internally reflected image light from the waveguide 220. The second de-coupling element 214B may decouple the image light from waveguide 220 and direct the image light towards eye 110. In some embodiments, the internally-reflected image light may be totally, or at least near totally, internally reflected. The first decoupling element 214A may be part of, affixed to, or formed in the top surface 216 of the waveguide 220. The second decoupling element 214B may be part of, affixed to, or formed in the bottom surface 218 of the waveguide 220, such that the first decoupling element 214A is opposed to the second decoupling element 214B. A light propagation area may extend between decoupling elements 214A-214B. In some embodiments, there may be an offset between the opposed decoupling elements 214A-214B. The offset may be along the x-axis and/or the y-axis of the 3D Cartesian coordinates illustrated in FIG. 2A. The decoupling elements 214A-214B may include a diffraction grating, a holographic grating, a volumetric Bragg grating, one or more cascaded reflectors, one or more prismatic surface elements, an array of holographic reflectors, or the like. The decoupling elements 214A-214B may form a decoupling area of HMD 100.

In scanning embodiments, display device 200 may be a scanning display device. Various embodiments of scanning display devices are discussed in conjunction with FIGS. 2C and 5A. However, briefly here, source assembly 230 may provide one or more 1D or 2D images via scanning projected light at a scanning rate sufficient to form an apparent image. As such, source assembly 230 may include one or more scanning mirrors. However, in other embodiments, the display device 200 is not a scanning display device, and display device 200 is not required to include a scanning mirror.

Whether a scanning embodiment or a non-scanning embodiment, source assembly 230 may project a 2D image on an image field through waveguide 220, via one or more arrays of light-emitting components (i.e., emitter arrays) included in source assembly 230. In some embodiments, the image emitted by emitter arrays may be conditioned and/or magnified by an optics system and/or light conditioning assembly (e.g., one or more lenses) before the pre-waveguide image light 208 is received by waveguide 220. Such optics systems are discussed in conjunction with at least optics systems 234 of FIGS. 2B-2C.

In various embodiments, an orientation and/or position of post-waveguide image light 204 exiting from waveguide 220 may be controlled by changing an orientation of the pre-waveguide image light 208 entering the coupling element 238. In such embodiments, scanning components included in an optics system of source assembly 230 may re-orient and/or re-position pre-waveguide image light 208 prior to image light entering coupling element 238.

In various embodiments, one or more logic devices (such as controller 202) may control the operations of source assembly 230. As noted above, controller 202 may include any logic device, such as but not limited to a microprocessor, microcontroller, central processing unit (CPU), graphical processing unit (GPU), gate arrays (e.g., an FPGA), an ASIC, or the like. The controller 202 may generate display instructions for the source assembly 230. The display instructions may include instructions to project one or more monochromatic or multi-chromatic images. Display instructions may include an image file (e.g., a bitmap). The display instructions may be received from another processing device included in HMD 100, a memory device of HMD 100, non-transitory computer-readable media, and/or a wireless/wired communication network. As described herein, the display instructions may further include instructions for moving (e.g., scanning) optical components within the source assembly 230, or individual light-emitting arrays included therein, or for moving the waveguide 220 by activating an actuation system. The controller 202 may include a combination of hardware, software, and/or firmware not explicitly shown herein so as not to obscure other aspects of the disclosure. The software and/or firmware may be stored via a storage device or non-transitory computer-readable media of HMD 100 or another computing device.

FIG. 2B illustrates a perspective view of another embodiment of display device 200. The embodiment of display device 200, shown in FIG. 2B, may also be included in a HMD, such as but not limited to HMD 100 of FIGS. 1A-1B. The embodiment of display device 200 shown in FIG. 2B may be an embodiment of (or at least similar to) any of display devices 104A-104B of FIGS. 1A-2A or display device 200 of FIG. 2A. Similarly to the embodiment shown in FIG. 2A, display device 200 includes various components, e.g., the waveguide configuration 106 or part of the waveguide configuration 106, controller 202, and source assembly 230. In alternative embodiments, the display device 200 is included in other HMDs, or in other systems that provide projected image light to a particular location.

Similar to the embodiment shown in FIG. 2A, display device 200 of FIG. 2B includes waveguide configuration 106. Waveguide configuration 106 includes waveguide 220, coupling element 238, and decoupling element 214B. Due to the perspective view of FIG. 2B, the bottom surface 218 of waveguide 220 is shown, but the top surface 216 of waveguide 220 is occluded by waveguide configuration 106. Similarly, the second decoupling element 214B is visible in FIG. 2B, but the first decoupling element 214A is occluded by the waveguide configuration 106. As shown in more detail in FIG. 2C, source assembly 230 may include light source 232 and optics system 234. Optics system 234 may include a light conditioning assembly 250. In various scanning embodiments, display device 200 may be a scanning display device. In such embodiments, optics system 234 may include a scanning mirror assembly 252.

Figure 5A:
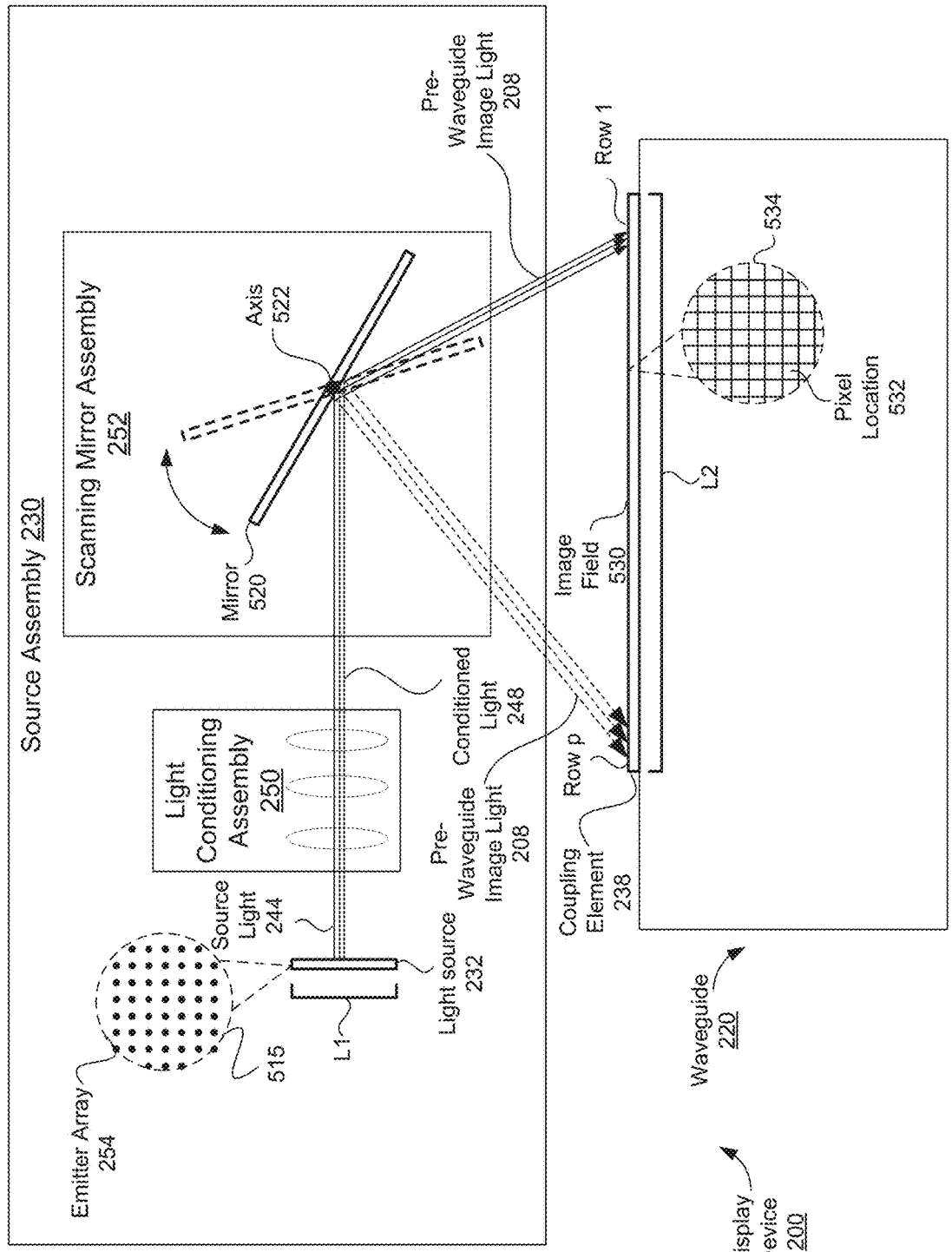
FIG. 5A is a diagram illustrating a scanning operation of a scanning embodiment of a display device, in accordance with an embodiment.

Various embodiments of a scanning display device are discussed in conjunction with at least FIG. 2C and FIG. 5A. However, briefly here, display device 200 may provide one or more 1D or 2D images via scanning projected light at a scanning rate sufficient to form an apparent image. As such, display device 200 may include one or more scanning mirrors. For instance, a scanning mirror assembly, which includes a scanning mirror, may be included in an optics system of source assembly 230. However, in other embodiments, the display device 200 is a non-scanning display device, and display device 200 need not include a scanning mirror assembly.

As discussed in conjunction with at least FIG. 2A and FIGS. 5A-5B, the source assembly 230 may project (scanned or non-scanned) image light on an image field through waveguide configuration 106, via one or more 1D and/or 2D arrays of light-emitting components (i.e., emitter arrays) included in light source 232. In scanning embodiments, a scanning mirror may be employed to scan the pre-waveguide image light 208 in such a manner to form scanned images on the image field. In some scanning embodiments, as well as non-scanning embodiments, the image emitted by emitter arrays included in light source 232 may be conditioned and/or magnified by optics system 234 and/or light conditioning assembly (e.g., one or more lenses) before the light is received by coupling element 238 and coupled to waveguide 220 or a screen. Such optics systems are discussed in conjunction with at least optics systems 234 of FIG. 2C.

Similar to FIGS. 1B and 2A, display device 200 may provide images for both eyes or for a single eye 110. For purposes of illustration, FIG. 2B shows the display device 200 associated with a single eye 110. Another display device (not shown), that is separated (or at least partially separated) from the display device 200, may provide image light to another eye of the user. In a partially separated system, one or more components may be shared between display devices for each eye.

The source assembly 230 may be an embodiment of (or at least be similar to) source assembly 230 of FIG. 2C. As such, the source assembly 230 generates pre-waveguide image light 208. The source assembly 230 includes a light source 232 and an optics system 234. The light source 232 is an optical component that generates pre-waveguide image light 208 using a plurality of light emitters arranged in a matrix, i.e., emitter arrays composing light-emitting components (LECs) or light emitters. Each light emitter may emit monochromatic light emitter. The light source 232 generates pre-waveguide image light 208 including, but not restricted to, red (R) image light, blue (B) image light, green (G) image light, infra-red image light, or image light of any other wavelength. While RGB image light, LECs, and pixels are often discussed in this disclosure, embodiments described herein are not limited to using red, blue and green as primary colors. Other colors are also possible to be used as the primary colors of the display device 200. Also, a display device in accordance with an embodiment may use more than three primary colors. Light source 232 may be an embodiment of, or at least be similar to, one of light sources 300 of FIG. 3.

The optics system 234 performs a set of optical processes, including, but not restricted to, focusing, combining, conditioning, and scanning processes on the image light generated by the light source 232. In some embodiments, the optics system 234 includes a light conditioning assembly that conditions pre-waveguide image light 208. In scanning embodiments, optics system 234 may include a scanning mirror assembly, as described below in detail in conjunction with at least FIGS. 2C and 5A. The source assembly 230 generates and outputs pre-waveguide image light 208. Similar to display device of FIG. 2A, the pre-waveguide image light 208 is received by coupling element 238, as is coupled to, as well as transmitted by, the waveguide 220.

The waveguide 220 is an optical waveguide that outputs post-waveguide image light 204 to an eye 110 of a user. The waveguide 220 receives the pre-waveguide image light 208 at one or more coupling elements 238, and guides the received input image light to one or more decoupling elements 214B. The coupling element 238 may be, for example, a diffraction grating, a holographic grating, some other element that couples the pre-waveguide image light 208 into the waveguide 220, or some combination thereof. For example, in embodiments where the coupling element 238 is diffraction grating, the pitch of the diffraction grating is selected such that total (or at least near total) internal reflection occurs, and the pre-waveguide image light 208 propagates internally toward the decoupling element 214B. The pitch of the diffraction grating may be in the range of 300 nm to 600 nm.

The decoupling element 214B decouples and/or outputs the total (or near total) internally reflected image light from the waveguide 220. Thus, waveguide may be an output waveguide. The decoupling element 214B may be, for example, a diffraction grating, a holographic grating, some other element that decouples image light out of the waveguide 220, or some combination thereof. For example, in embodiments where the decoupling element 214B is a diffraction grating, the pitch of the diffraction grating is chosen to cause incident image light to exit the waveguide 220. In scanning embodiments, an orientation and position of the post-waveguide image light 204 exiting from the waveguide 220 may be controlled by changing an orientation and position of the pre-waveguide image light 208 entering the coupling element 238. The pitch of the diffraction grating may be in the range of 300 nm to 600 nm.

The waveguide 220 may be composed of one or more materials that facilitate total (or near total) internal reflection of the pre-waveguide image light 208. For example, the waveguide 220 may be composed of silicon, plastic, glass, or polymers, or some combination thereof. The waveguide 220 has a relatively small form factor. For example, the waveguide 220 may be approximately 50 mm wide along X-dimension, 30 mm long along Y-dimension and 0.5-1 mm thick along Z-dimension.

Similarly to controlling the operations of the embodiments of source assembly 230 of FIG. 2A, controller 202 may control the image rendering operations of the embodiment of source assembly 230 shown in FIG. 2B. The controller 202 determines instructions for the source assembly 230 based at least on the one or more display instructions. Display instructions are instructions to render one or more images. In some embodiments, display instructions may be an image file (e.g., bitmap). In another example, the display instructions may be received from a console of a augmented-reality (AR) system, a virtual-reality (VR) system, and/or a mixed-reality (MR) system, not shown in FIG. 2B. In scanning embodiments, display instructions may include scanning instructions that are used by the source assembly 230 to generate images via scanning pre-waveguide image light 208. For example, the scanning instructions may include a type of a source of image light (e.g., monochromatic, polychromatic), a scanning rate, an orientation of a scanning apparatus, one or more illumination parameters, or some combination thereof. The controller 202 includes a combination of hardware, software, and/or firmware not shown here so as not to obscure other aspects of the disclosure.

FIG. 2C illustrates a schematic block diagram of the source assembly 230 of FIGS. 2A-2B, in accordance with various embodiment. That is, source assembly 230 of FIG. 2C may be an embodiment of (or at least similar to) source assembly 230 of FIG. 2A and/or source assembly 230 of FIG. 2B. As such, source assembly 230 includes a light source 232 and an optics system 234. In some embodiments, source assembly 230 may be a scanning source assembly, while in other embodiments, source assembly 230 is a non-scanning source assembly. The various operations and/or functionalities of source assembly 230 may be controlled via executing instructions on a processor device and/or controller device. When the instructions are executed, the processor device and/or controller device may cause the performance of various actions and/or steps. The instructions may be stored on a non-transitory computer-readable storage medium.

Light source 232 includes a plurality of source elements, shown schematically as source elements 254A-254F. Source elements may include an array of light-emitting components (LECs), i.e., a source element may include and/or be an embodiment of an emitter array. Various embodiments of emitter arrays are discussed in conjunction with FIGS. 3-4. However, briefly here, an emitter array may be a 2D arrays of LECs, such as but not limited to light-emitting diodes (LEDs). As discussed below, the number, arrangement, and configuration of the plurality of source elements may vary based on whether the source assembly is a scanning source assembly, or a non-scanning source assembly.

Optics system 234 includes a light conditioning assembly 250. In scanning embodiments, in addition to light conditioning assembly 250, optics system 234 may include a scanning mirror assembly 252. In non-scanning embodiments of source assembly 230, the optics system 234 need not, but may, include scanning mirror assembly 252. Because the inclusion of scanning mirror assembly 252 is optional, depending upon whether source assembly 230 is a scanning or non-scanning embodiment, scanning mirror assembly 252 is indicated in FIG. 2C via a dashed box.

In non-scanning embodiments, light source 232 may include more source elements (e.g., emitter arrays), than in scanning embodiments. In non-scanning embodiments, there may exist a one-to-one mapping (or correspondence) between individual LECs included in the source elements and pixel regions of a display device, such as but not limited to pixel regions of display device 104 of FIGS. 1A-1B and/or display device 200 of FIGS. 2A-2B. In scanning embodiments, each LEC may be mapped to more than one pixel region of a display device. For example, a scanning mirror included in scanning mirror assembly 252 may be employed to scan light emitted by a single LEC to multiple pixels of the display device. Thus, via the scanning mirror assembly 252, a single LEC may illuminate multiple LECs, and thus less source elements may be required for scanning embodiments. For example, in a scanning embodiment of source assembly 230, light source 232 may include source elements 254A-254C, whereas in a non-scanning embodiment, light source 232 may include source elements 254A-254C, as well as source elements 254D-254F.

Because scanning embodiments may include less source elements, the source elements in a scanning embodiment may be referred to as a "1D" arrangement of source elements or emitter arrays. The source elements in a non-scanning embodiment may be referred to as a "2D" arrangement of source elements or emitter arrays. Note that even though the 1D and 2D nomenclatures are employed, each of the source elements (e.g., source element 254A) may include a 2D array of LECs. That is, in scanning embodiments that include source elements 254A-254C, but do not include source elements 254D-254F, the included source elements are said to be arranged in a 1D array, i.e., a 1D arrangement of 2D emitter arrays. In non-scanning embodiments that include source elements 254A-254F, the included source elements are said to be arranged in a 2D array, i.e., a 2D arrangement of 2D emitter arrays. It should also be noted that the 1D arrangement of source elements 254A-254C and the 2D arrangement of source elements 254A-254F are illustrative only, and the total number of, arrangements of, and configurations of source elements may vary from embodiment to embodiment. The source assembly 230 may generate light in accordance with scanning instructions from the controller 202.

The light source 232 is a source of light that generates image light. In some embodiments, the image light is collimated or at least partially collimated image light. In other embodiments, the image light need not be collimated. The light source 232 emits light in accordance with one or more illumination parameters received from the controller 202. As discussed above, the light source 232 includes one or more source elements 254A-254C, and/or source elements 254A-254F, either configuration which may be collectively referred to as source elements 254. Source elements may be comprised of light-emitting components (LECs), as discussed throughout.

The individual source elements 254 of an emitter array may include one or more compact, efficient and/or powerful sources of lights, e.g., LECs with at least ultra-high brightness, low power consumption, and a low footprint. The source elements 254 may include one or more arrays of light-emitting components (LECs), such as but not limited to light-emitting diodes (LEDs), e.g., μLEDs, organic LEDs (OLEDs), a superluminescent LED (SLED), and organic μLEDs. A μLED may be an LED with features sizes ranging between sub-microns to a hundreds of microns. Various embodiments of μLEDs are discussed in conjunction with FIGS. 6A-6B. In some embodiments, GaN-based inorganic LEDs can be made orders of magnitude brighter than OLEDs with a light emission area of few microns.

In one embodiment, the source elements 254 may be arranged in a concave curved fashion. For example, the source elements 254 may have a radius of curvature ranging from few millimeters to few centimeters depending on the display size and a length of few millimeters. An advantage of a curved array is that it is easier to form a compact lens to have high quality image on curved surface without correcting the field of curvature of the lens. In alternate embodiments, the source elements 254 may be arranged in a flat and/or linear fashion.

The source element 254 emits a source light 244 to the optics system 234. In some embodiments, the source light 244 may emit one or more colors (e.g. red, green, and blue). For example, the source element 254A may emit red source light, the source element 254B may emit blue source light, and the source element 254C emits green source light. In non-scanning embodiments that additionally include source elements 254D-254F, the source element 254AD may emit red source light, the source element 254E may emit blue source light, and the source element 254F emits green source light. Additionally, in some embodiments, one or more of the source elements may emit light in the infrared, or light of other non-visible wavelengths.

The optics system 234 may include a light conditioning assembly 250 and a scanning mirror assembly 252. The light conditioning assembly 250 conditions the source light 244 and emits conditioned light 248. In embodiments that include scanning mirror assembly 252, the conditioned light is provided to the scanning mirror assembly 252. In scanning embodiments, light condition assembly 250 may condition source light 244 for incidence on scanning mirror assembly 252. In non-scanning embodiments, light condition assembly 250 may condition source light 244 for being received by a waveguide configuration, such as but not limited to waveguide configuration of FIG. 1B and FIGS. 2A-2B. The light conditioning assembly 250 includes one or more optical components that condition the light from the light source 232. Conditioning light from the light source 232 may include, for example, expanding, collimating, correcting for one or more optical errors (e.g., field curvature, chromatic aberration, etc.), some other adjustment of the light, or some combination thereof. The light conditioning assembly 250 conditions the source light 244 and emits conditioned light 248. In non-scanning embodiments, conditioned light 248 may be outputted as pre-waveguide image light 208. In scanning embodiments, the conditioned light 248 may be received my scanning mirror assembly 252, and scanned and/or further conditioned being outputted as pre-waveguide image light 208.

The scanning mirror assembly 252 includes one or more optical elements that redirect image light via one or more reflective portions of the scanning mirror assembly 252. Where the image light is redirected towards is dependent upon specific orientations of the one or more reflective portions. In some embodiments, the scanning mirror assembly 252 includes a single scanning mirror that is configured to scan in at least two dimensions. In other embodiments, the scanning mirror assembly 252 may include a plurality of scanning mirrors that each scan in orthogonal directions to each other. The scanning mirror assembly 252 may raster scan (horizontally, or vertically). In some embodiments, the scanning mirror assembly 252 may perform a controlled vibration along the horizontal and/or vertical directions with a specific frequency of oscillation to scan along two dimensions and generate a two-dimensional projected line image of the media presented to user's eyes. For example, the scanning mirror assembly 252 may undergo an oscillation with peak-to-peak amplitude of few hundreds of nanometers per second along the vertical direction based on the desired frequency of oscillation. The scanning mirror assembly 252 emits a pre-waveguide image light 208 based on the conditioned light 248. The scanning mirror assembly 252 outputs the pre-waveguide image light 208 at a particular orientation (in accordance with the scanning instructions) and towards a waveguide configuration.

In some embodiments, the scanning mirror assembly 252 includes a galvanometer mirror. For example, the galvanometer mirror may represent any electromechanical instrument that indicates that it has sensed an electric current by deflecting a beam of image light with one or more mirrors. The galvanometer mirror may be configured to scan in at least one orthogonal dimension to generate the scanned pre-waveguide image light 208. The pre-waveguide image light 208 from the galvanometer mirror represents a two-dimensional line image of the media presented to user's eyes. As noted above, in non-scanning embodiments, source assembly 230 need not include scanning mirror assembly 252.

The controller 202 controls the light source 232 and/or the scanning mirror assembly 252. The controller 202 takes content for display, and divides the content into discrete sections. The controller 202 instructs the light source 232 to sequentially present the discrete sections. In scanning embodiments, the controller 202 instructs the scanning mirror assembly 252 to scan the presented discrete sections to different areas of a coupling element 238 of the waveguide 220. Accordingly, when scanned light 238 exits the waveguide 220, separate portions of scanned light 238 are presented in different locations of the coupling element 238. While each discrete section is presented at different times, the presentation and scanning of the discrete sections occurs fast enough such that a user's eye integrates the different sections into a single image or series of images. In non-scanning embodiments, the controller 202 instructs the light source 232 to present different areas of the coupling element 238 of the waveguide 220 into different discrete sections.

For example, in scanning embodiments, controller 202 segments the content into scan lines, via scanning instructions. The scan lines are scanned out to different areas of the coupling element 238 of the waveguide 220. When scanned pre-waveguide image light 208 exits the waveguide 220, each of the lines are presented at a different location, as post-waveguide image light 204, which a user's eye integrates into a single 2D image or series of 2D images.

For example, the scanning instructions may cause the source assembly 230 to scan out an image in accordance with a scan pattern (e.g., raster, interlaced, etc.). The scanning instructions control an intensity of light emitted from the light source 232, and the optics system 234 scans out the image by rapidly adjusting orientation of the emitted light. If scanned at a sufficient frequency, a human eye integrates the scanned pattern into a single 2D image. In non-scanning embodiments, the source assembly 230 may similarly generate 2D images without the need for a scan pattern because the light source 232 includes one or more LECs for each pixel of the display device. For example, based on display instructions, controller 202 may operate individual LECs included in source elements 254A-254F to illuminate pixels corresponding the 2D images.

Figure 3:
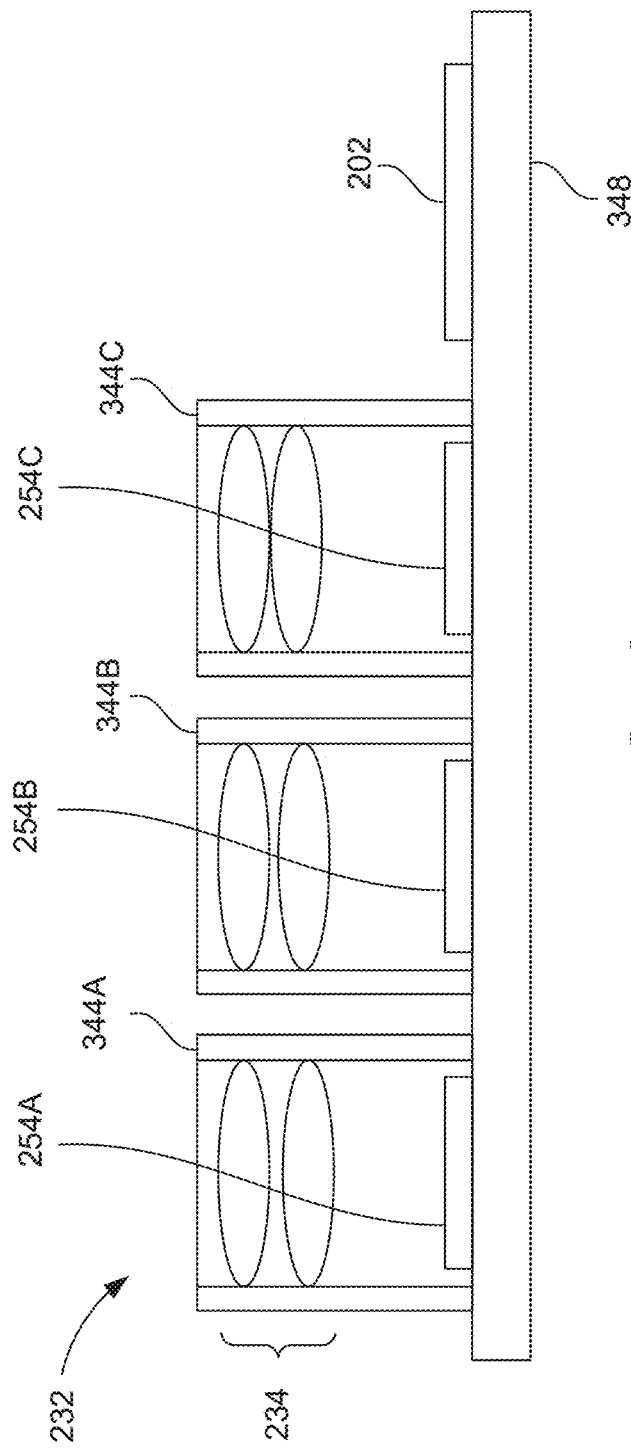
FIG. 3 illustrates a cross-sectional view of an embodiment of a light source included in the display device of FIGS. 2A-2C, in accordance with the various embodiments.

FIG. 3 illustrates a cross-sectional view of an embodiment of light source 232 included in the display device of FIGS. 2A-2C, in accordance with the various embodiments. As shown in FIG. 3, one embodiment of a light source 232 may include a first source element 254A, a second source element 254B, and a third emitter array 254C. As used herein, the terms source element and emitter array may be used interchangeably. Each of the emitter arrays 254A, 254B, and 254C may be disposed in an array housing 344A, 344B, and 344C, respectively. For convenience, the emitter arrays 254A-254C may be referred to collectively as emitter arrays 254, and also individually as emitter array 254. Similarly, the array housings 344A-344C may be referred to collectively as array housings 344, or individually as array housing 344. As discussed in conjunction with at least FIG. 2C, each of the emitter arrays 254 may include a 2D array of light-emitting components (e.g., LEDs). FIG. 3 illustrates a 1D arrangement of emitter arrays for a scanning embodiment. However, as discussed in conjunction with at least FIG. 2C, a 2D arrangement of emitter arrays may be employed for non-scanning embodiments.

Each of the array housings 344 may include an optics system 234, which may include one or more optical components, such as lenses (e.g., glass, plastic, or meta-material lenses), prisms, filters, scanning mirrors, and the like. As discussed in conjunction with FIG. 2C, optics system 234 may include a light conditioning assembly. In scanning embodiments, optics system 234 may additionally include a scanning mirror assembly, such as but not limited to scanning mirror assembly 252 of FIG. 2C. In other embodiments, the optics system 234 is not housed within housings 344. Each of the source elements 254A-254C may include a separate and/or distinct optics system.

As discussed in conjunction with at least FIG. 2C, the optics system 234 may condition and/or alter the direction or control other characteristics of source light 244 emitted by emitter arrays 254. As shown in FIG. 3, the emitter arrays 254 may be secured to a common structure, such as a backplane 348 or printed circuit board (PCB). The backplane 348 may include a logic device, such as but not limited to an ASIC, processor, FPGA, controller 202, or the like. Backplane 348 may include electrical contacts (e.g., leads) that electrically couple individual LECs of the emitter arrays 254 to controller 202. In other embodiments, the controller 202 may be disposed elsewhere on the HMD 100 of FIGS. 1A-1B, secured either directly or indirectly to the frame 102 of FIG. 1A.

Each of the emitter arrays 254 may be a monochromatic emitter array having a 1D or 2D configuration of individual emitters (e.g., LEDs) of a single color. As described herein, a green colored light may be understood as light composed of photons with a range of wavelengths between about 500 nanometers (nm) to about 555 nm. Furthermore, as described herein, red colored light may be understood as light composed of photons with a range of wavelengths between about 622 nm to about 780 nm. Blue colored light may be understood as light composed of photons with a range of wavelengths between about 440 nm to about 492 nm. A monochromatic emitter array 254 may emit light within a narrow wavelength range, rather than a single wavelength, in some embodiments. For example, a monochromatic emitter array 254 may emit colored light (e.g., red, green, or blue photons) within a narrow wavelength range of 5-10 nm in width.

One or more chromatic filters, which may facilitate a simplified projection lens design with reduced achromatic performance requirements, may be employed to further narrow the wavelength range of an emitter array. In some embodiments, the emitter array 254A may include only red light-emitting components, the emitter array 254B may include only green light-emitting components, and the emitter array 254C may include only blue light-emitting components. Under the direction of controller 202, each of the emitter arrays 254A-254C may produce a monochromatic 2D image according to the color produced by its respective emitters. Accordingly, the three monochromatic emitter arrays 254A-254C may simultaneously emit three monochromatic images (e.g., a red image, a green image, and a blue image composed of image light) towards optics system 234.

As discussed elsewhere, the three monochromatic images may be interposed, composited, or otherwise combined to generate a full color image. For example, the controller 202 may receive a full-color image to be displayed to a user and then decompose the full-color image into multiple monochromatic images, such as a red image, a green image, and a blue image. That is, the full-color image may be separated, or otherwise decomposed into three monochromatic images of primary colors. As described herein, the waveguide configuration 106 of FIG. 1B and FIGS. 2A-2B may combine (or recombine) the three monochromatic images to produce a full-color image or a poly-chromatic (or multi-chromatic) image, via post-waveguide image light 204 and directed toward the eye 110 of FIG. 1B and FIGS. 2A-2B. In yet other examples, one or more emitter arrays 254A-254C may produce light of multiple wavelengths, ranges of wavelengths, or other forms of light other than monochromatic light.

In some embodiments, a calibration and/or alignment system (not shown in FIG. 3) may be employed to align the multiple monochromatic images (e.g., via mechanical movement, or scanning, of one or more of the monochromatic emitter arrays 254A-254C or movement of the one or more of the monochromatic images by one or more pixels as emitted from their associated monochromatic emitters 254A-254C) to produce a desired or intended, properly aligned multi-chromatic image.

Figure 4:
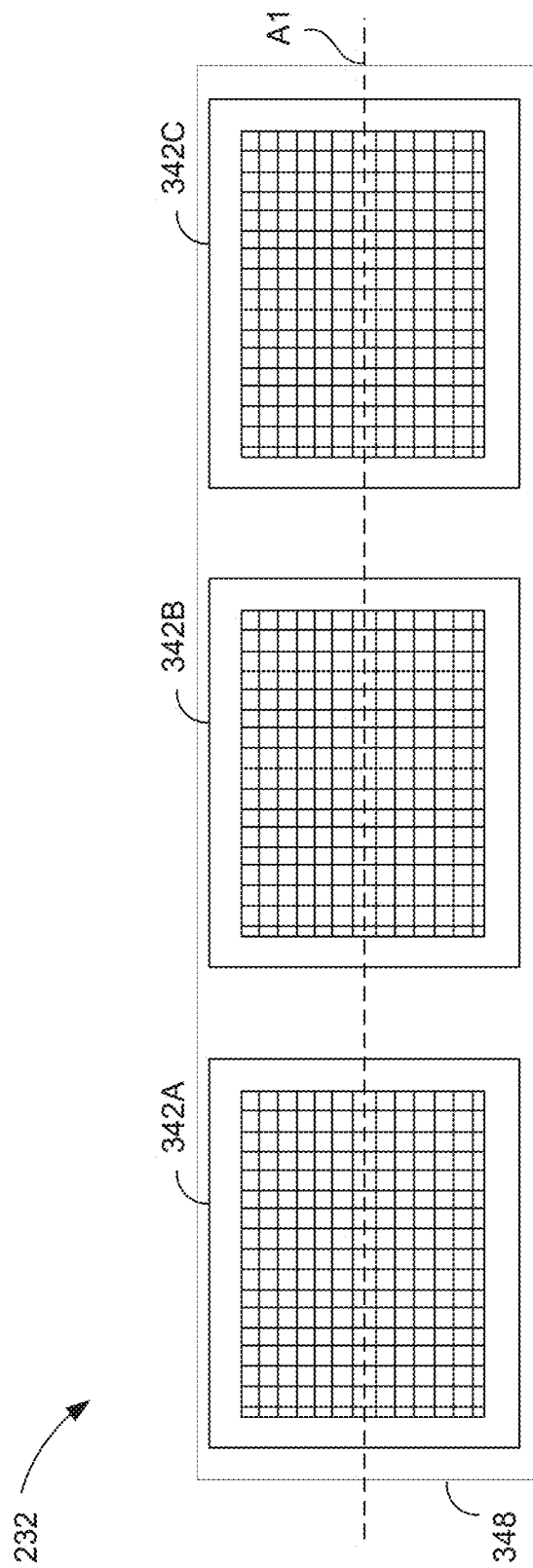
FIG. 4 shows a top view of a light source that includes a 1D configuration of emitter arrays, according to some embodiments.

FIG. 4 shows a top view of light source 232 that includes a 1D configuration of emitter arrays 254A-254C, according to some embodiments. The 1D configuration shown in FIG. 4 is a linear configuration of 2D emitter arrays 254A-254C along the A1 axis. In the embodiment of FIG. 4, the individual emitter arrays 254A-254C have an aspect ratio greater than 1.0 (i.e., emitter arrays 254 are rectangular 2D arrays of LECs). However, in other embodiments, the aspect ratio of the emitter arrays 254A-254C may be equal to 1.0 (i.e., emitter arrays 254 are square 2D arrays of LECs). The particular linear configuration may be arranged according to a longer side of the rectangular arrays 254A-254C. While the emitter arrays 254A-254C may have a 1D configuration of the emitters (e.g., LEDs) in some scanning embodiments, in other non-scanning embodiments, the emitter arrays 254 may be arranged in a (square or rectangular) 2D configuration. In yet other embodiments, the emitter arrays 254A-254C may have other non-linear configurations (e.g., oval, circular, or otherwise round in some fashion) while defining a first dimension (e.g., a width) and a second dimension (e.g. a length) that is orthogonal to the first direction, with one dimension being equal or unequal to each other. The emitters included in emitter arrays 254A-254C may have a 2D emitter array configuration with more than 1000×1000 emitters. In some embodiments, the emitter arrays 254A-254C may be 1D emitter arrays, rather than 2D emitter arrays, as shown in FIG. 4. Various other combinations are also within the scope of the present disclosure. Emitter arrays 254A-254C may be bonded and/or electrically coupled to backplane 348.

Formation of an Image

Figure 5C:
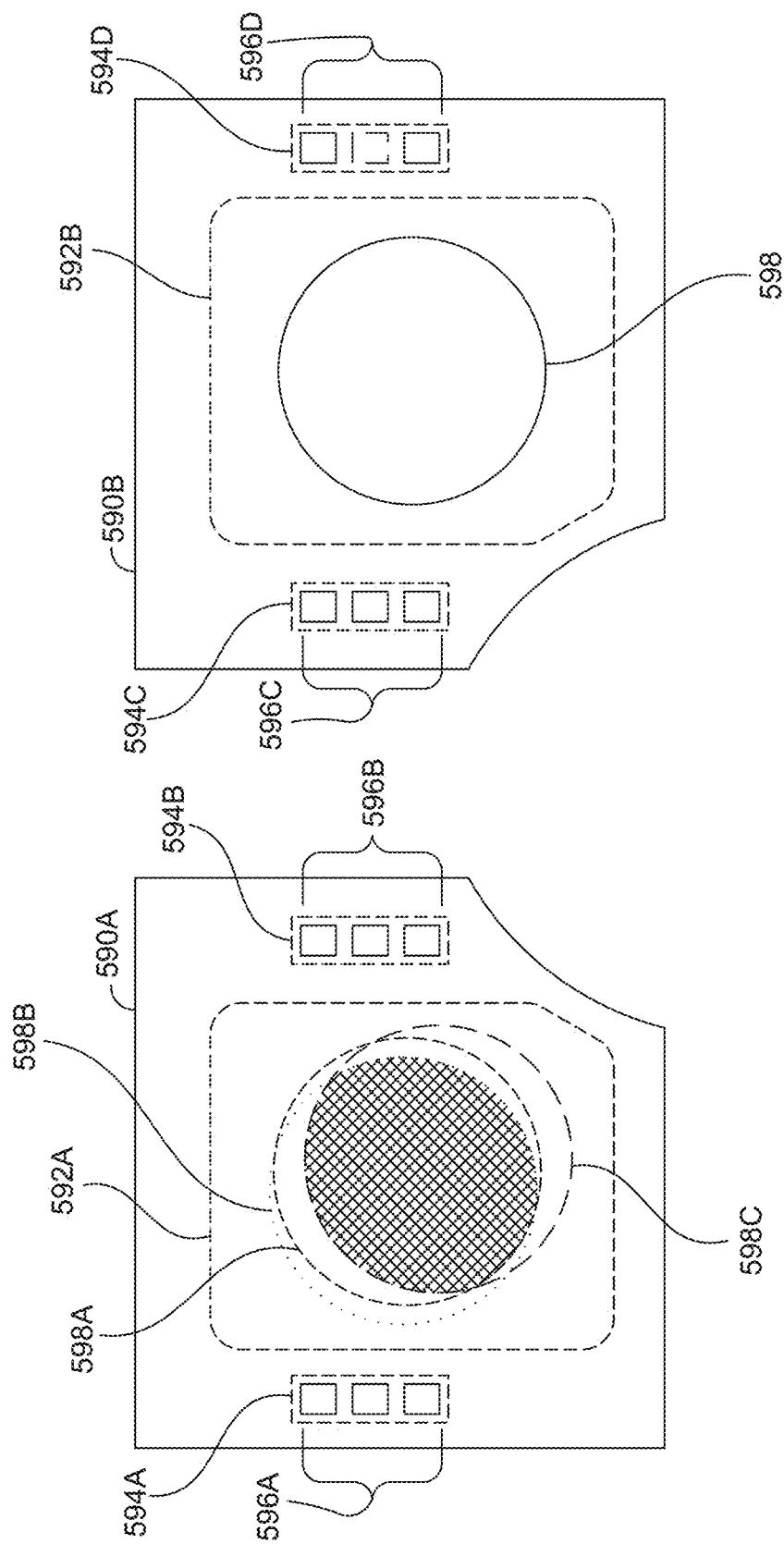
FIG. 5C is a top view of a display device, in accordance with some embodiments.

FIGS. 5A-5C illustrate how images and pupil replications are formed in display device 200 based on different structural arrangement of light emitters, in accordance with different embodiments. An image field 530 of coupling element 238 is an area of coupling element 238 that receives the pre-waveguide image light 208, emitted by the light source 232 and forms an image on the coupling element 238, which is transmitted via waveguide 220. For example, an image field 530 may correspond to a portion of the coupling element 238. Note that decoupling element 214B of FIGS. 2A-2B also includes an image field that outputs the post-waveguide image light 204 to the eye 110 of the user. In some cases, an image field is not an actual physical structure but is an area to which the pre-waveguide or post-waveguide image light is projected and which the image is formed. In one embodiment, the image field is a surface of the coupling element 238 of FIGS. 2A-2B and the image formed on the image field is magnified as light travels through the waveguide 220 of FIGS. 2A-2B. In another embodiment, an image field is formed after light passing through the waveguide which combines the light of different colors to form the image field. In some embodiments, the image field may be projected directly into the user's eyes.

FIG. 5A is a diagram illustrating a scanning operation of a scanning embodiment of display device 200, in accordance with an embodiment. Display device 200 of FIG. 5A may be a scanning embodiment of display device 104 of FIGS. 1A-1B and/or a scanning embodiment of display device 200 of FIGS. 2A-2B, or a scanning embodiment of any other display device discussed herein. As discussed in conjunction with at least FIGS. 2A-2C, display device 200 may include source assembly 230 and a waveguide configuration that includes waveguide 220 and coupling element 238. Coupling element 238 includes an image field 520, of length L2. The image field 520 may include a 2D arrays of pixel locations 532, represented by the blocks in inset 534. The 2D arrays of pixel locations 238 may include p rows, indexed via row 1 through row p. The source assembly 230 includes a light source 232 and a light condition assembly 250. Because display device 200 of FIG. 5A is a scanning display device, the source assembly of FIG. 5A additionally includes a scanning mirror assembly 252, which includes mirror 520, which is a scanning mirror.

As discussed throughout, the light source 232 includes a 1D configuration of emitter arrays (or source elements) 254. That is, light source 232 includes multiple rows and columns of light-emitting components (LECs) that are included in one or more 2D emitter arrays 254. Individual LECs included emitter array 254 are represented by the dots in inset 515. Thus, in some embodiments, emitter arrays may be comprised of one or more arrays of LECs, such as but not limited to light-emitting diodes (LEDs). Various embodiments of emitter arrays are discussed in conjunction with at least FIGS. 3-4. Various non-limiting embodiments of LEDs are discussed in conjunction with at least FIGS. 6A-6B.

In some embodiments, scanning light source 232 may include a 1D configuration of emitter arrays, wherein a separate emitter array 254 of the 1D configuration is dedicated to each primary color of the 2D images to the presented. In various embodiments, the light source 232 may include more than one emitter array 254 for each primary color. Light source 232 may emit source light 244 as a set of collimated beams of light. For example, FIG. 5A shows multiple beams of source light 244 that are emitted by one or more columns of LECs included in emitter array 254. As discussed in conjunction with at least FIGS. 2A-2C, light conditioning assembly 250 may condition source light 244 and transmit resulting conditioned light 248 to scanning mirror assembly 252.

Conditioned light 248 irradiates scanning mirror 520 of scanning mirror assembly 252. The mirror 520 reflects, scans, and projects pre-waveguide image light 208. The mirror 520 may rotate about an axis 522. The mirror 520 may be a microelectromechanical system (MEMS) mirror or any other suitable mirror. As the mirror 520 rotates about rotational axis 522, the pre-waveguide image light 208 is directed to a different part of the image field 530 of coupling element 238, as illustrated by the reflected part of the pre-waveguide image light 208 in solid lines and the reflected part of the pre-waveguide image light 208 in dash lines.

At a particular orientation of the mirror 520 (i.e., a particular rotational angle), the emitter arrays 254 illuminate a portion of the image field 530 (e.g., a particular subset of multiple pixel locations 532 on the image field 530). In one embodiment, the LECs of emitter arrays 254 are arranged and spaced such that a light beam from each emitter array 254 is projected on a corresponding pixel location 532. In another embodiment, small light emitters such as μLEDs are used for emitter arrays 254 so that light beams from a subset of multiple light emitters are together projected at the same pixel location 532. In other words, a subset of multiple emitter arrays 254 collectively illuminates a single pixel location 532 at a time.

The image field 530 may also be referred to as a scan field because, when the pre-waveguide image light 208 is projected to an area of the image field 530, the area of the image field 530 is being illuminated by the pre-waveguide image light 208. The image field 530 may be spatially defined by a matrix of pixel locations 532 (represented by the blocks in inset 534) in rows and columns. A pixel location here refers to a single pixel. The pixel locations 532 (or simply the pixels) in the image field 530 sometimes may not actually be additional physical structure. Instead, the pixel locations 532 may be spatial regions that divide the image field 530. Also, the sizes and locations of the pixel locations 532 may depend on the projection of the pre-waveguide image light 208 from the source assembly 230. For example, at a given angle of rotation of the mirror 520, light beams emitted from the light source 232 may fall on an area of the image field 530. As such, the sizes and locations of pixel locations 532 of the image field 530 may be defined based on the location of each light beam.

In some embodiments, a pixel location 532 may be subdivided spatially into subpixels (not shown). For example, a pixel location 532 may include a red subpixel, a green subpixel, and a blue subpixel. The red subpixel corresponds to a location at which one or more red light beams are projected, etc. When subpixels are present, the color of a pixel 532 is based on the temporal and/or spatial average of the subpixels.

The number of rows and columns of emitter arrays 254 of the light source 232 may or may not be the same as the number of rows and columns of the pixel locations 532 in the image field 530. In various 1D configurations of emitter arrays 254, the number of emitter arrays 254 in a row is equal to the number of pixel locations 532 in a row of the image field 530 while the number of emitter arrays 254 in a column is two or more, but fewer than the number of pixel locations 532 in a column of the image field 530.

In other 1D configurations of emitter arrays 254, the configuration of emitter arrays 254 of light source 232 has the same number of columns of emitter arrays 254 as the number of columns of pixel locations 532 in the image field 530, but has fewer rows than the image field 530. For example, in one specific embodiment, the light source 232 has approximately 1280 columns of emitter arrays 254, which is the same as the number of columns of pixel locations 532 of the image field 530. The light source 232 may have a first length L1, which is measured from the first row to the last row of emitter arrays 254. The image field 530 has a second length L2, which is measured from row 1 to row p of the scan field 530. In one embodiment, L2 is greater than L1 (e.g., L2 is 50 to 10,000 times greater than L1).

As noted, scanning embodiments of display device 200 include a 1D configuration of emitter arrays 254, where the number of rows of pixel locations 532 is larger than the number of rows of emitter arrays 254 in some embodiments, the display device 200 may employ the mirror 520 to project the light 502 to different rows of pixels at different times. As the scanning mirror 520 rotates and the pre-waveguide image light 208 scans through the image field 530 quickly, a scanned image is formed on the image field 530. In some embodiments, the light source 232 may have a smaller number of columns than the image field 530. The mirror 520 may rotate in two dimensions to fill the image field 530 with light (e.g., a raster-type scanning down rows then moving to new columns in the image field 530).

The display device 200 may operate in predefined display periods. A display period may correspond to a duration of time in which an image is formed. For example, a display period may be associated with the frame rate (e.g., a reciprocal of the frame rate). In the particular scanning embodiment shown in FIG. 5A, scanning mirror 520 mirror rotates as a particular rotational frequency, and the display period is as a scanning period that is dependent upon the rotational frequency of mirror 520. A complete cycle of rotation of the mirror 520 may correspond to the scanning period. A scanning period herein refers to a predetermined cycle time during which the entire image field 530 is completely scanned. The scanning of the image field 530 is controlled by the mirror 520.

The light generation of the display device 200 may be synchronized with the rotation of the mirror 520. For example, in one embodiment, the rotational movement of the mirror 520 from an initial position that projects light to row 1 of the image field 530, to the last position that projects light to row p of the image field 530, and then back to the initial position is equal to a scanning period. The scanning period may also be related to the frame rate of the display device 200. By completing a scanning period, an image (e.g., a frame) is formed on the image field 530 per scanning period. Hence, the frame rate may correspond to the number of scanning periods in a second.

As the mirror 520 rotates, light scans through the image field and images are formed. The actual color value and light intensity (brightness) of a given pixel location 532 may be an average of the color various light beams illuminating the pixel location during the scanning period. After completing a scanning period, the mirror 520 rotates back to the initial position to project light onto the first few rows of the image field 530 again, except that a new set of driving signals may be fed to the emitter arrays 254. The same process may be repeated as the scanning mirror 520 rotates in cycles. As such, additional images are formed in the scanning field 530 in different frames.

FIG. 5B illustrates a waveguide configuration 106 of a display device that forms images and replications of images, in accordance with various embodiments. Replications of images may be referred to as pupil replications. Waveguide configuration 106 may be employed in the scanning embodiments, as well as the non-scanning embodiments discussed herein. Waveguide configuration includes light source 232 and waveguide 220. Light source 232 may be included in a source assembly, such as but not limited to source assembly 230 of FIGS. 2B-2C and FIG. 5A. Thus, in scanning embodiments, light source 232 in a scanning light source, and in non-scanning embodiments, light source 232 is a non-scanning light source. As such, the light source 232 may comprise three separate emitter arrays 254, as described in conjunction with at least FIGS. 3-4. The primary colors of emitter arrays 254 may be red, green, and blue, or another combination of other suitable primary colors. The various operations and/or functionalities of waveguide configuration 106 may be controlled via executing instructions on a processor device and/or controller device. When the instructions are executed, the processor device and/or controller device may cause the performance of various actions and/or steps. The instructions may be stored on a non-transitory computer-readable storage medium.

In non-scanning embodiments, the number of light emitters (e.g., individual LECs) in emitter arrays 254 may be equal to the number of pixel locations within an image field (not shown in FIG. 5B). As such, each LEC included in emitter array 254 of a non-scanning embodiment may be dedicated to generating images at a particular pixel location of the image field. In scanning embodiments, the number of light emitters in emitter arrays 254 may be equal may be less than the number of pixel locations within the image field. Thus, in scanning embodiments, each LEC included in emitter array 254 may be dedicated to generating images at multiple pixel locations of the image field. In still other embodiments, scanning and non-scanning configurations may be combined to generate multiple pupil replications.

Thus, the embodiments depicted in FIG. 5B may provide for the projection of many image replications (e.g., pupil replications) or decoupling a single image projection at a single point. Accordingly, additional embodiments of disclosed NEDs may provide for a single decoupling element. Outputting a single image toward the eye-box 108 of FIG. 1B may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configuration 106 that provide for pupil replication, as described herein, may provide for one-dimensional replication, while other embodiments may provide for two-dimensional replication. For simplicity, FIG. 5B illustrates one-dimensional pupil replication. Two-dimensional pupil replication may include directing light into and outside the plane of FIG. 5B. FIG. 5B is presented in a simplified format. The detected gaze of the user may be used to adjust the position and/or orientation of the emitter arrays 254 individually or the light source 232 as a whole and/or to adjust the position and/or orientation of the waveguide configuration.

The waveguide configuration 106 is disposed in cooperation with a light source (not shown in FIG. 5B), which may include one or more monochromatic or polychromatic emitter arrays 254 secured, Bonded, and/or electrically coupled to a support structure 348 (e.g., a printed circuit board, a backplane, or another structure). The support structure 348 may be coupled to the frame 102 of FIG. 1A. The waveguide configuration 106 may be separated from the light source 232 by an air gap having a distance D1. The distance D1 may be in a range from approximately 50 μm to approximately 500 μm in some examples. The monochromatic or polychromatic images or images projected from the light source 232 (as pre-waveguide image light 208) may pass through the air gap toward the waveguide configuration 106. Any of the light source embodiments described herein may be utilized as the light source 232.

The waveguide 220 may be formed from a glass or plastic material. The waveguide 220 may include a coupling area 544 (which includes coupling elements 238) and a decoupling area formed by decoupling elements 214A on a top surface 216 and decoupling elements 214B on a bottom surface 218 in some embodiments. The area within the waveguide 220 in between the decoupling elements 214A and 214B may be considered a propagation area 550, in which light images (formed by pre-waveguide image light 208) received from the light source 232 and coupled into the waveguide 220 by coupling elements 238 included in the coupling area 544 may propagate laterally within the waveguide 220.

The coupling area 544 may include coupling elements 238 configured and dimensioned to couple light of a predetermined wavelength, e.g., red, green, or blue light. When a white light emitter array is included in the light source 232, the portion of the white light that falls in the predetermined wavelength may be coupled by each of the coupling elements 238. In some embodiments, the coupling elements 238 may be gratings, such as Bragg gratings, dimensioned to couple a predetermined wavelength of light. In some examples, the gratings of each coupling element 238 may exhibit a separation distance between gratings associated with the predetermined wavelength of light that the particular coupling element 238 is to couple into the waveguide 220, resulting in different grating separation distances for each coupling element 238. Accordingly, each coupling element 238 may couple a limited portion of the white light from the white light emitter array when included. In other examples, the grating separation distance may be the same for each coupling element 238. In some examples, coupling element 238 may be or include a multiplexed coupler.

As shown in FIG. 5B, pre-waveguide image light 208 may include a red image 560A, a blue image 560B, and a green image 560C. The images 560A-560C may be coupled by the coupling elements 238 of the coupling area 544 into the propagation area 550 and may begin traversing laterally within the waveguide 220. In one embodiment, the red image 560A, the blue image 560B, and the green image 560C, each represented by a different dash line in FIG. 5B, may converge to form an overall image that is represented by a solid line. For simplicity, FIG. 5B may show an image by a single arrow, but each arrow may represent an image field where the image is formed. In another embodiment, red image 560A, the blue image 560B, and the green image 560C, may correspond to different spatial locations.

A portion of the light may be projected out of the waveguide 220 (e.g., post-waveguide light 204) after the light contacts the decoupling element 214A for one-dimensional pupil replication, and after the light contacts both the decoupling element 214A and the decoupling element 214B for two-dimensional pupil replication. In two-dimensional pupil replication embodiments, the light may be projected out of the waveguide 220 at locations where the pattern of the decoupling element 214A intersects the pattern of the decoupling element 214B.

The portion of light that is not projected out of the waveguide 220 by the decoupling element 214A may be internally reflected off the decoupling element 214B. The decoupling element 214B may reflect all (or near-all) incident light back toward the decoupling element 214A, as depicted. Accordingly, the waveguide 220 may combine the red image 560A, the blue image 560B, and the green image 560C into a polychromatic image instance, which may be referred to as a pupil replication 562. The polychromatic pupil replication 562 may be projected toward the eye-box 108 of FIG. 1B and to the eye 110, which may interpret the pupil replication 562 as a full-color image (e.g., an image including colors in addition to red, green, and blue). Pupil replication 562 may include at least a portion of the post-waveguide image light 204. The waveguide 220 may produce tens or hundreds of pupil replications 562 or may produce a single replication 562.

In some embodiments, the waveguide configuration 106 may differ from the configuration illustrated in FIG. 5B. For example, the coupling area 544 may be different. Rather than including gratings as coupling element 238, an alternate embodiment may include a prism that reflects and refracts received image light, directing it toward the decoupling element 214A. Also, while FIG. 5B generally shows the light source 232 having multiple emitter arrays 254 coupled to the same support structure 348, other embodiments may employ a light source 232 with separate monochromatic emitter arrays 254 located at disparate locations about the waveguide configuration (e.g., one or more emitter arrays 254 located near a top surface of the waveguide configuration and one or more emitter arrays 254 located near a bottom surface of the waveguide configuration).

Also, although only three emitter arrays are shown in FIG. 5B (e.g., a scanning 1D configuration of emitter arrays), an embodiment may include more or fewer emitter arrays. For example, in one embodiment, a display device may include two red emitter arrays, two green emitter arrays, and two blue emitter arrays (e.g., a non-scanning 2D configuration of emitter arrays). In one case, the extra set of emitter panels provides redundant light emitters for the same pixel location. In another case, one set of red, green, and blue panels is responsible for generating light corresponding to the most significant bits of a color dataset for a pixel location while another set of panels is responsible for generating light corresponding the least significant bits of the color dataset.

FIG. 5C is a top view of a display system (e.g., an NED), in accordance with an embodiment. The NED may include a pair of waveguide configurations. The included waveguide configuration may be an embodiment of, or at least similar to, at least one of waveguide configuration 106 of FIG. 1B, the waveguide configuration of FIG. 2A, and/or waveguide configuration 106 of FIG. 5B. Each waveguide configuration projects images to an eye of a user. In some embodiments not shown in FIG. 5C, a single waveguide configuration that is sufficiently wide to project images to both eyes may be used.

The waveguide configurations 590A and 590B may each include a decoupling area 592A or 592B. In order to provide images to an eye of the user through the waveguide configuration 590, multiple coupling areas 594 may be provided in a top surface of the waveguide of the waveguide configuration 590. The coupling areas 594A and 594B may include multiple coupling elements to interface with light images provided by an emitter array set 596A and an emitter array set 596B, respectively. Each of the emitter array sets 596 may include a plurality of monochromatic light emitter arrays, as described herein. As shown, the emitter array sets 596 may each include a red emitter array, a green emitter array, and a blue emitter array. As described herein, some emitter array sets may further include a white emitter array or an emitter array emitting some other color or combination of colors.

The right eye waveguide 590A may include one or more coupling areas 594A, 594B, 594C, and 594D (all or a portion of which may be referred to collectively as coupling areas 594) and a corresponding number of emitter array sets 596A, 596B, 596C, and 596D (all or a portion of which may be referred to collectively as the light emitter array sets 596). Accordingly, while the depicted embodiment of the right eye waveguide 590A may include two coupling areas 594 and two emitter array sets 596, other embodiments may include more or fewer. In some embodiments, the individual emitter arrays of an emitter array set may be disposed at different locations around a decoupling area. For example, the emitter array set 596A may include a red emitter array disposed along a left side of the decoupling area 592A, a green emitter array disposed along the top side of the decoupling area 592A, and a blue emitter array disposed along the right side of the decoupling area 592A. Accordingly, emitter arrays of an emitter array set may be disposed all together, in pairs, or individually, relative to a decoupling area.

The left eye waveguide 590B may include the same number and configuration of coupling areas 594 and LED sets 596 as the right eye waveguide 590A, in some embodiments. In other embodiments, the left eye waveguide 590B and the right eye waveguide 590A may include different numbers and configurations (e.g., positions and orientations) of coupling areas 594 and emitter array sets 596. Included in the depiction of the left waveguide 590A and the right waveguide 590B are different possible arrangements of pupil replication areas of the individual emitter arrays included in one emitter array set 596. In one embodiment, the pupil replication areas formed from different color emitter arrays may occupy different areas, as shown in the left waveguide 590A. For example, a red emitter array of the emitter array set 596 may produce pupil replications of a red image within the limited area 598A. A green emitter array may produce pupil replications of a green image within the limited area 598B. A blue emitter array may produce pupil replications of a blue image within the limited area 598C. Because the limited areas 598 may be different from one monochromatic emitter array to another, only the overlapping portions of the limited areas 598 may be able to provide full-color pupil replication, projected toward the eye-box 108. In another embodiment, the pupil replication areas formed from different color emitter arrays may occupy the same space, as represented by a single solid-lined circle 598 in the right waveguide 590B.

In one embodiment, waveguide portions 590A and 590B may be connected by a bridge waveguide (not shown). The bridge waveguide may permit light from the emitter array set 596A to propagate from the waveguide portion 590A into the waveguide portion 590B. Similarly, the bridge waveguide may permit light emitted from the emitter array set 596B to propagate from the waveguide portion 590B into the waveguide portion 590A. In some embodiments, the bridge waveguide portion may not include any decoupling elements, such that all light totally internally reflects within the waveguide portion. In other embodiments, the bridge waveguide portion 590C may include a decoupling area. In some embodiments, the bridge waveguide may be used to obtain light from both waveguide portions 590A and 590B and couple the obtained light to a detection (e.g. a photodetector), such as to detect image misalignment between the waveguide portions 590A and 590B.

Structure of a Light-Emitting Diode (LED)

FIG. 6A is a cross-sectional diagram illustrating an LED 600A, in accordance with one embodiment. LED 600A may be a light-emitting component (LEC) included in any of the emitter arrays discussed herein. As such, LED 600A may be included in a head-mounted device (HMD), such as but not limited to HMD 100 of FIGS. 1A-1B. LED 600A may be an LED die. In various embodiments, LED 600A is a micro-LED (μLED), where the feature sizes are on the order of a few microns (μm) to hundreds of microns. In at least some embodiments, the feature size of LED 600A may be less than a micron (i.e., the feature size may be sub-micron). LED 600A is an example of an LED that may be positioned on and bonded to a surface of a display substrate (e.g., backplane 348 of FIGS. 3-4 or the target substrate 832 shown in FIGS. 8A-8B) to emit visible or invisible light. The target substrate may be a backplane for a display device, such as but not limited to backplane 348 of FIGS. 3-4.

In some embodiments, LED 600A is formed on a substrate layer (not shown in FIG. 6A), or semiconductor wafer, and includes, among other components a semiconductor layer 602, a dielectric layer 614 disposed on the semiconductor layer 602, a p-contact 608 disposed on a first portion of the dielectric layer 614, and an n-contact 606 disposed on a second portion of the semiconductor layer 602. The semiconductor layer 602 may be formed on a substrate layer, such as but not limited to a gallium substrate layer. Thus, semiconductor layer 602 may be a gallium (Ga) semiconductor layer. Note that semiconductor layer 602 may be formed of other semiconductor lattices or materials, such as gallium nitride (GaN), gallium phosphide (GaP), gallium arsenide (GaAS), or any other semiconductor material appropriate for the fabrication of an LED. Note that this discussion of LED 600A is non-limiting, and LED 600A may be formed via other semiconductor lattices other than gallium-based lattices. In some embodiments, the semiconductor layer 602 is formed on the substrate layer as an epitaxial layer.

The p-contact 608 and the n-contact 606 are the electrical contacts coupled to the p-type and n-type regions of LED 600A, respectively. That is, p-contact 608 may be employed to electrically couple the p-type region of LED 600A to other semiconductor devices, such as but not limited to a target substrate. Likewise, n-contact 606 may be employed to electrically couple the n-type region of LED 600A to other semiconductor devices. For example, p-contact 608 and n-contact 606 may be bonded to corresponding electrical contacts of a backplane to bond LED 600A to the backplane. P-contact 608 and n-contact 606 may singly, or collectively, be referred to as electrical contacts, electrical interconnects, electrical leads, or contact pads of LED 600A. In some embodiments, p-contact 608 and n-contact 606 may include metal bumps. In some non-limiting embodiments, p-contact 608 and n-contact 606 may be comprised of a copper-tin (CuSn) alloy.

LED 600A may be less than 100 microns in diameter with a parabolic structure etched onto the LED die during wafer processing to form a quasi-collimated light beam emerging from the light-emitting face 604. In at least one embodiment, LED 600A may be less than 100 microns in diameter. LED 600A may include highlight extraction efficiency and outputs quasi-collimated light because of its shape. As shown in FIG. 6A, semiconductor layer 602 may be shaped into a mesa-structure 610. An active (or light emitting) layer 612 (or 'active light-emitting area") is included in the mesa-structure 610. The active layer 612 may correspond to the region of the band gap of LED 600A. A voltage difference applied across the p-contact 608 and the n-contact 606 may result in the active layer 612 emitting visible or invisible photons (i.e., light). The mesa 610 has a truncated top, on a side opposed to the light-emitting face 604. The mesa 610 also has a curved or near parabolic shape to form a reflective enclosure for light within LED 600A. The arrows L show how light emitted from the active layer 612 is reflected off the walls of the mesa 610 toward the light-emitting face 604 at an angle sufficient for the light to escape the LED 600A (e.g., within the angle of total internal reflection).

The structure of LED 600A results in an increase in the efficiency of light emission when compared to unshaped or conventional LED chips. As such, the LED 600A produces light visible to the human eye with reduced current (e.g., nano-amps of drive current). LED 600A is an example of an LED die, although other types of LED dies may be assembled onto a backplane for a display, as discussed herein.

Figure 6B:
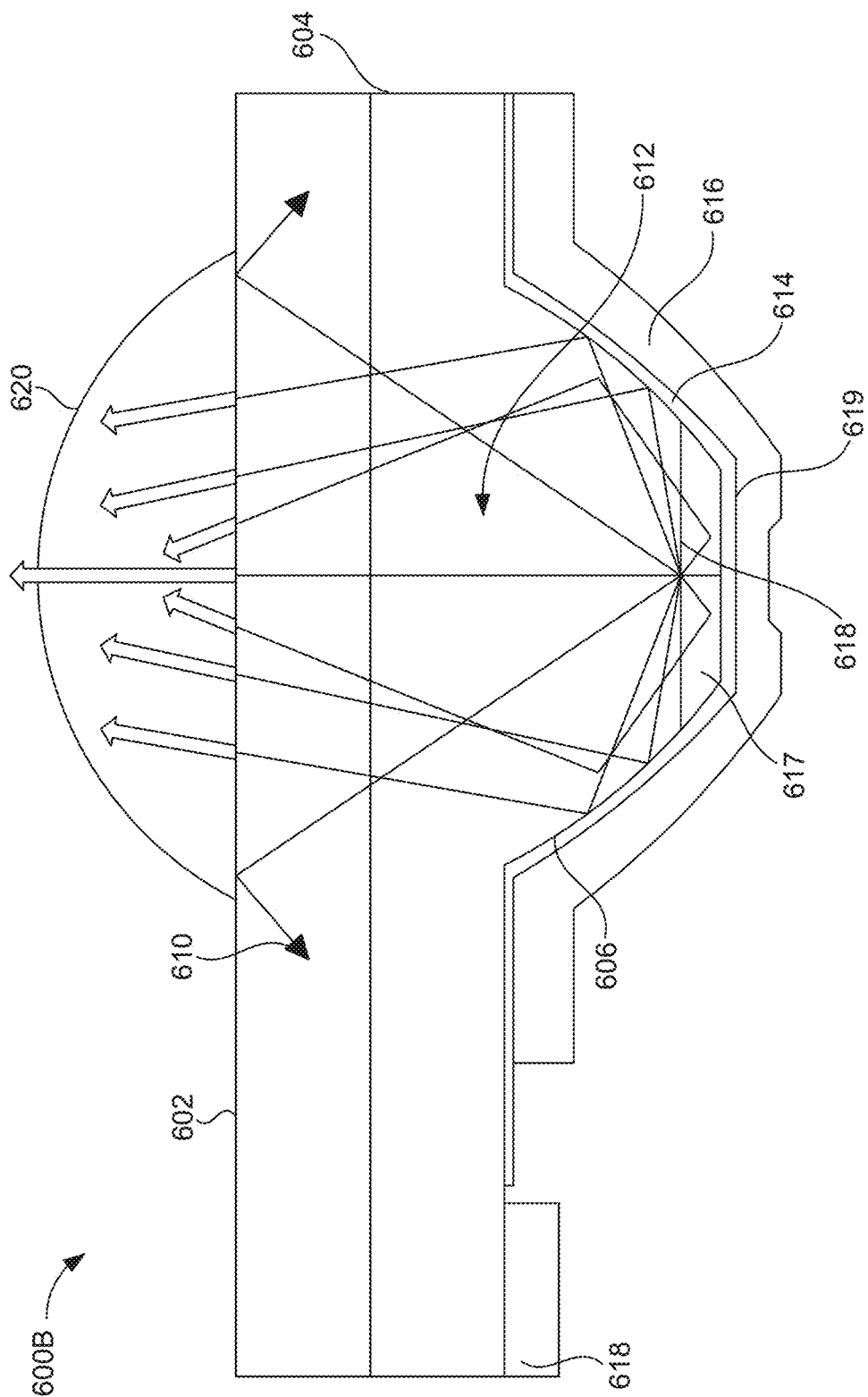
FIG. 6B is a cross-sectional diagram illustrating another embodiment of an LED, in accordance with one embodiment.

FIG. 6B depicts a μLED 600B that is similar in many respects to the μLED 600A of FIG. 6A. The μLED 600B may further include a μlens 620, which may be formed over the parabolic structure. In some embodiments, the μlens 620 may be formed by applying a polymer coating over the μLED 600A, patterning the coating, and reflowing the coating to achieve the desired lens curvature. The μlens 620 may be disposed over an emissive surface to alter a chief ray angle of the μLED 600B. In another embodiment, the μlens 620 may be formed by depositing a μlens material above the μLED 600A (for example, by a spin-on method or a deposition process). For example, a μlens template (not shown) having a curved upper surface can be patterned above the μlens material. In some embodiments, the μlens template may include a photoresist material exposed using a distributing exposing light dose (e.g., for a negative photoresist, more light is exposed at a bottom of the curvature and less light is exposed at a top of the curvature), developed, and baked to form a rounding shape. The μlens 620 can then be formed by selectively etching the μlens material according to the μlens template. In some embodiments, the shape of the μlens 620 may be formed by etching into the substrate 602. In other embodiments, other types of light-shaping or light-distributing elements, such as an annular lens, Fresnel lens, or photonic crystal structures, may be used instead of μlenses.

In some embodiments, μLED arrangements other than those specifically discussed above in conjunction with FIGS. 6A and 6B may be employed as a μLED in any of the various embodiments of emitter arrays discussed herein. For example, the μLED may include isolated pillars of epitaxially grown light-emitting material surrounded by a metal reflector. The pixels of an emitter array may also include clusters of small pillars (e.g., nanowires) of epitaxially grown material that may or may not be surrounded by reflecting material or absorbing material to prevent optical crosstalk.

In some examples, the μLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as μlenses, diffractive structures, or photonic crystals. Other processes for fabricating the μLEDs of the dimensions noted above other than those specifically disclosed herein may be employed in other embodiments.

Enhanced Isotropic Probe Cards

As described, embodiments herein provide enhanced isotropic and anisotropic probe cards for probing a semiconductor device via a single touchdown event. More specifically, the enhanced probe cards discussed herein may be employed to simultaneously test and/or screen a plurality of semiconductor devices integrated on an integrated semiconductor device, e.g., an integrated circuit (IC) device. The anisotropic embodiments may be enabled to individually address each of the plurality of discrete devices (e.g., individual μLEDs) integrated on a monolithic IC. Because each of the discrete devices may be addressed, during testing of the IC, the current drawn from each of the discrete devices may be measured, observed, and/or sensed. In contrast, the isotropic embodiments may not be enabled to measure, observe, and/or sense the electrical current drawn from each of the discrete device. Whether the embodiment is anisotropic or isotropic, an enhanced probe card may be employed to test and/or screen the integrated semiconductor device prior to packaging the semiconductor die. That is, the enhanced probe cards may be employed to test and/or screen an exposed semiconductor die. The semiconductor die to be tested may be referred to as a device under test (DUT).

In some non-limiting embodiments, the DUT (a semiconductor device) may be a light-emitting component (LEC), such as but not limited to a light-emitting diode (LED). In at least one embodiment, the LED may be a micro-LED (µLED), such as but not limited to the LEDs and/or µLEDs discussed in conjunction with at least FIGS. 6A-6B. In other embodiments, the semiconductor device need not be a light-emitting device. For example, the semiconductor device may include a transistor, a non light-emitting diode, a resistive element, a capacitor, a microelectricalmechanical (EMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device. In some embodiments, each of the individual semiconductor devices (e.g., discrete µLEDs) integrated on the DUT (e.g., the integrated semiconductor die) has at least a cathode and anode pair for providing an input signal (e.g., a voltage difference) to operate the device.

Figure 7A:
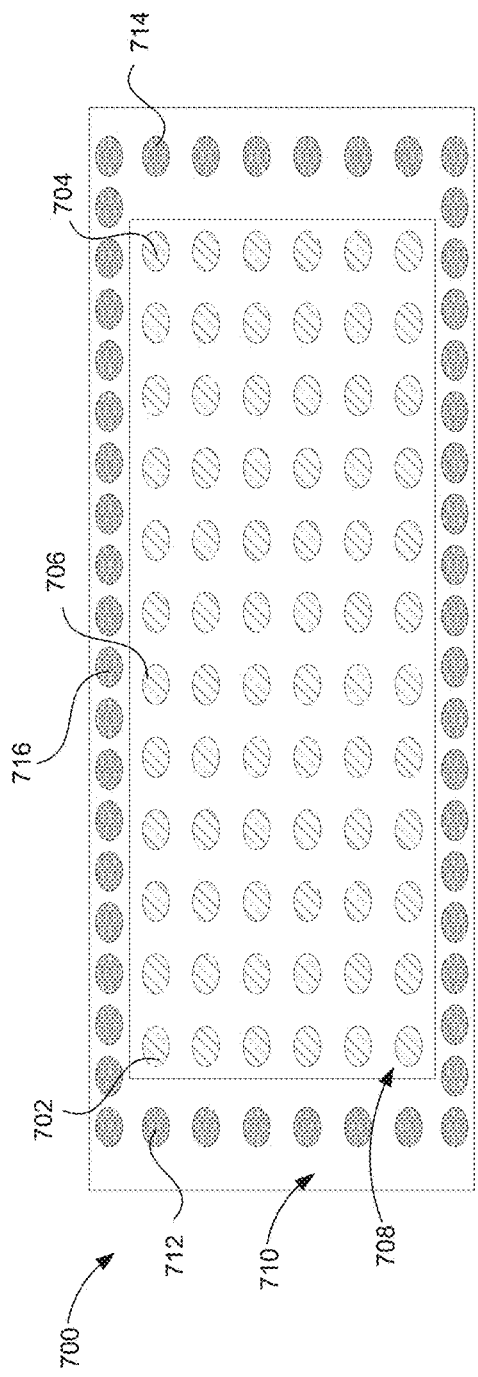
FIG. 7A includes a diagram illustrating a top-down view of a non-limiting embodiment of an integrated semiconductor device that may be tested via the various embodiments of enhanced probe cards discussed herein.

FIG. 7A includes a diagram illustrating a top-down view of a non-limiting embodiment of an integrated semiconductor device 700 that may be tested via the various embodiments of enhanced probe cards discussed herein. Integrated semiconductor device 700 may be a semiconductor die (e.g., a µLED die). The integrated µLED die 700 may include a plurality of discrete and/or individual µLEDs that are integrated with and/or embedded within the µLED die 700. In one non-limiting embodiment, µLED die 700 may include $>10^6$ discrete µLEDs. Non-limiting embodiments of a discrete µLED are discussed in conjunction with LED 600A of FIG. 6A and/or LED 600B of FIG. 6B. For example, µLED die 700 may include $>10^6$ discrete instances of LED 600A and/or $10^6$ discrete instances of LED 600B.

Each of the discrete µLEDs integrated on µLED die 700 may include a cathode and anode pair (and corresponding contact pads for each of the cathode and anode in a cathode/anode pair) that enable the application of a voltage difference (e.g., an input signal) to operate the µLED. As discussed in conjunction with at least FIGS. 6A-6B, a discrete µLED may include an n-contact (e.g., n-contact 606 of FIGS. 6A-6B) and a p-contact (e.g., p-contact 608 of FIGS. 6A-6B). In some embodiments of a discrete µLED (e.g., LED 600A of FIG. 6A or LED 600B of FIG. 6B), the n-contact may serve as the µLED's anode and the p-contact may serve as the µLED's cathode. In other embodiments, the n-contact may serve as the µLED's cathode and the p-contact may serve as the µLED's anode.

In various embodiments, the cathodes and corresponding anodes (and pairs of corresponding contact pads) may be arranged such that the cathodes are arranged within a first portion 708 of the µLED die 700 and the corresponding anodes are arranged within a second portion 710 of the µLED die 700. The plurality of anodes within the first portion 708 of the µLED die 700 may include a first anode 702, a second anode 704, and a third anode 706. Each of the plurality of anodes may have a corresponding cathode. For example, the plurality of cathodes within the second portion 710 of the µLED die 700 may include a first cathode 712, a second cathode 714, and a third cathode 716. Each of the plurality of anodes and each of the plurality of cathodes may include an electrically-conductive contact pad. The first anode 702 and the corresponding first cathode 712 may be the anode and cathode pair for a first discrete µLED of the µLED die 700. The second anode 704 and the corresponding second cathode 714 may be the anode and cathode pair for a second discrete µLED of the µLED die 700. The third anode 706 and the corresponding third cathode 716 may be the anode and cathode pair for a third discrete µLED of the µLED die 700. In some embodiments, an anode may be an n-contact (e.g., n-contact 606 of FIGS. 6A-6B) of a discrete µLED (e.g., µLED 600A of FIG. 6A and/or µLED 600B of FIG. 6B) and the corresponding cathode may be a p-contact (e.g., p-contact 608 of FIGS. 6A-6B) of the discrete µLED. In other embodiments, the cathode may be the n-contact of the discrete µLED and the corresponding anode may be a p-contact of the discrete µLED.

When looking from the top-view of FIG. 7A, the contact pads for each of the plurality of anodes and the contact pads for each of the plurality of cathodes are shown as shaded ovals. In FIG. 7A, the lighter shaded ovals in the first portion 708 of the µLED die 700 represent the contact pads for the plurality of anodes, and the darker shaded ovals in the second portion 710 of the µLED die 700 represent the contact pads for each of the plurality of cathodes. In other embodiments, the lighter shaded ovals in the first portion 708 of the µLED die 700 represent the contact pads for the plurality of cathodes, and the darker shaded ovals in the second portion 710 of the µLED die 700 represent the contact pads for each of the plurality of anodes. Although not shown in FIG. 7A, in some embodiments, there is a one-to-one mapping between the plurality of cathodes and the plurality of anodes, such that each cathode/anode pair (as defined by the one-to-one mapping) serves as the n-contact and corresponding p-contact for a discrete µLED As shown in FIG. 7A, the first portion 708 of the µLED die 700 is surrounded by the second portion 710 of the µLED die 700, such that the plurality of cathodes is arranged about a 1D or 2D array of plurality of anodes. More particularly, the plurality of cathodes may be arranged around a perimeter of the µLED die 700, and the plurality of anodes may be arranged in a 1D or 2D array that is surrounded by the plurality of cathodes. In other embodiments, the plurality of cathodes may be included in the first portion 708 of the µLED die 700, and the plurality of anodes may be included in the second portion 710 of the µLED die 700. Thus, in these other embodiments, the plurality of anodes may be arranged around the perimeter of the µLED die 700 and the plurality of cathodes may be arranged in a 1D or 2D array that is surrounded by the plurality of anodes. Note that the layout of the plurality of anodes and the layout of the plurality of cathodes shown in FIG. 7A is non-limiting, and other arrangements of the layout of the cathodes and anodes are possible. Although µLED die 700 may include, for example, $>10^6$ anodes and/or $>10^6$ cathodes, for purposes of clarity, only a small fraction of the contact pads (e.g., the light and dark shaded ovals) of the anodes and cathodes are shown in FIG. 7A. The distance between adjacent contact pads (e.g., the pitch of the anodes and cathodes) may be <5 µm, and the dimensions of the contact pads (e.g., the feature size) of the anodes and cathodes (and corresponding contact pads) may be submicron. The µLED die 700 may be included in a display device of a head mounted device (HMD). As discussed throughout, the HMD device may be a virtual-reality (VR) device, augmented-reality (AR) device, and/or a mixed-reality device, such as but not limited to any of the HMDs discussed herein.

Figure 7B:
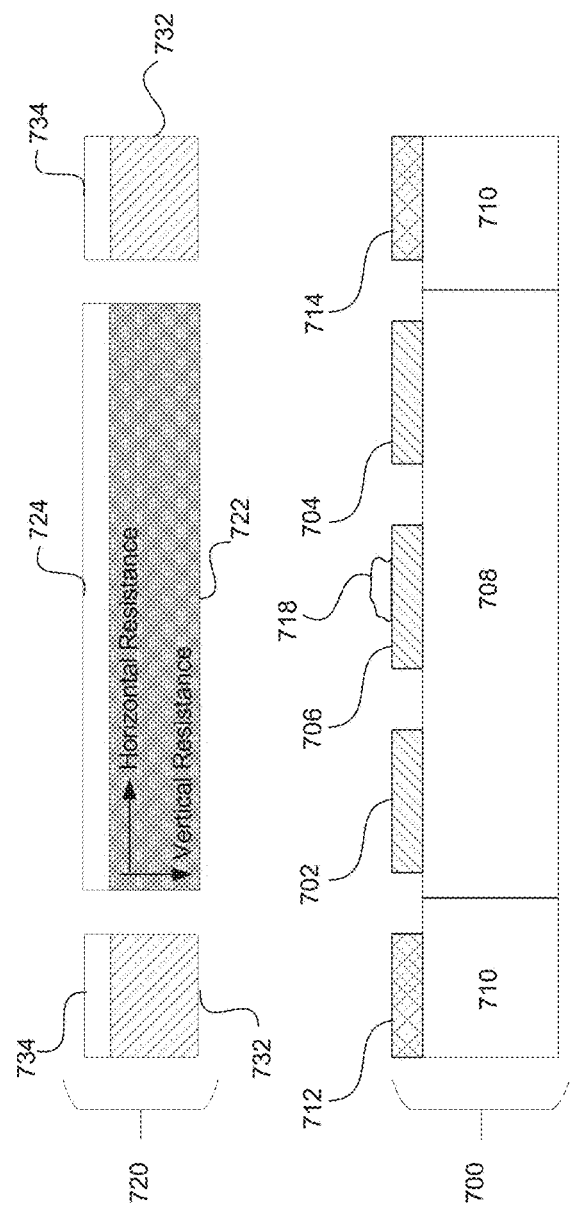
FIGS. 7B-7C include diagrams illustrating a side view of the integrated semiconductor device of FIG. 7A and an isotropic enhanced probe card that is consistent with the various embodiments.
Figure 7C:
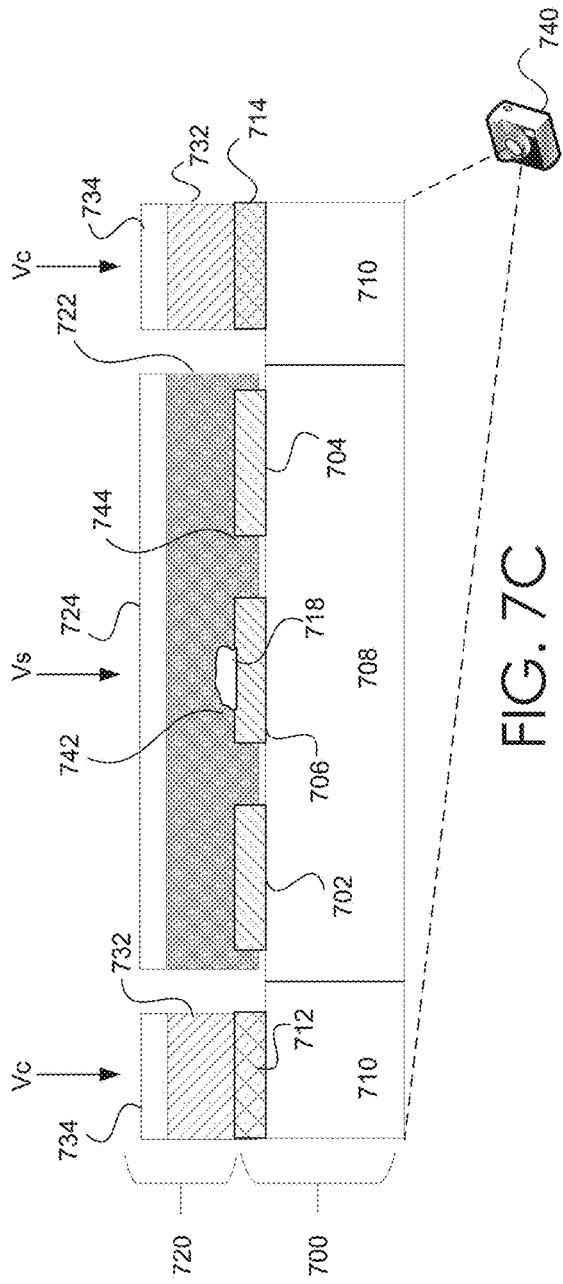

FIGS. 7B-7C include diagrams illustrating a side view of the integrated semiconductor device 700 of FIG. 7A and an isotropic enhanced probe card 720 that is consistent with the various embodiments. Isotropic probe card 720 may be employed to simultaneously operate, test, and/or screen each of the discrete semiconductor devices (e.g., individual μLEDs). Accordingly, probe card 720 may be employed to operate, test, and/or screen semiconductor device 700 via a single touchdown event. In particular, FIG. 7B shows semiconductor device 700 and the probe card 720 before the touchdown event, whereas FIG. 7C shows the semiconductor device 700 and the probe card 720 after the touchdown event.

As discussed below, the touchdown event includes a translation of at least one of semiconductor device 700 and/or probe card 720, such that a first contact 722 of the probe card 720 makes parallel-contact with the contact pads for each of the plurality of anodes (or alternatively the cathodes) of the discrete semiconductor devices integrated on semiconductor device 700 and one or more other contacts 734 of the probe card 720 makes parallel-contact with each of the cathodes (or alternatively the anodes) of the discrete semiconductor devices integrated on semiconductor device 700. After the touchdown event, and as shown in FIG. 7C, the probe card 720 may be in electrical contact with the contact pads for each of the plurality of anodes and each of the plurality of cathodes. Thus, probe card 720 may operate each of the discrete semiconductor devices integrated on the semiconductor device 700 providing an operating signal (e.g., providing a voltage difference across the anode and corresponding cathode) to each discrete semiconductor device.

As discussed in conjunction with FIG. 7A, semiconductor device 700 may be a μLED die that includes a plurality ($>10^6$) of integrated μLEDs. In the side view of FIGS. 7B-7C, and for purposes of clarity, only a small fraction of the plurality of anodes (and corresponding contact pads) of μLED die 700 and only a small fraction of the plurality of cathodes (and corresponding contact pads) of μLED die 700 are shown. For example, as shown in the side view of FIG. 7B, μLED die 700 includes the first anode 702, the second anode 704, and the third anode 706, in the first portion 708 of the μLED die 700. Likewise, as shown in the side view of FIG. 7B, μLED die 700 includes first cathode 712 (which corresponds to first anode 702) and second cathode 714 (which corresponds to second anode 704), in the second portion 710 of the μLED die 700. The corresponding contact pads for the first anode 702, the second anode 704, the third anode 706, the first cathode 712, and the second cathode 714 are shown with vertical profiles that extend above the top surface of the μLED die 700. As discussed below, enhanced probe card 720 may be immune to the presence of particles (e.g., dust particles) on the plurality of cathodes and anodes. Thus, FIG. 7B shows a dust particle 718 on the surface of the contact pad for third anode 706.

Probe card 720 includes an electrically-conductive first contact 722 and one or more electrically-conductive other contacts 732. The electrical-conductivity of first contact 722 (and of the one or more other contacts 732) may be isotropic with respect to the vertical and horizontal directions. Probe card 720 includes a first electrode 724 that is electrically coupled to the first contact 722 and one or more other electrodes 734 that are electrically coupled to the one or more other contacts 732. The first contact 722 may include a conformal (or elastic) film, sheet, and/or coating that is electrically conductive and coats at least a portion of the first electrode 724. The first electrode 724 may be a planar surface that is electrically-conductive. In some embodiments, such as those discussed in conjunction with FIGS. 7B-7C, the electrically-conductive and elastic film and/or sheet may be applied to the surface of the first electrode 724. The film may be employed for multiple touchdown events for multiple μLED dies, In other embodiments, such as those discussed in conjunction with FIGS. 8A-8C, the film may be applied to the upper surface of μLED die 700, and washed away from the surface of the μLED die 700 after the testing and/or screening of the μLED die 700.

The first contact 722 of probe card 720 may be characterized by a vertical resistance (e.g., a non-zero finite resistance to the flow of electrical current the vertical direction as indicated by the vertical arrow in FIG. 7B) and a sheet (or horizontal) resistance (e.g., a non-zero finite resistance to the flow of electrical current the horizontal direction as indicated by the horizontal arrow in FIG. 7B). The vertical arrow (marked "Vertical Resistance") in FIG. 7B indicates the direction of electrical current, within first contact 722, which is impeded by the vertical resistance of the first contact 722. Likewise, the horizontal arrow (marked "Horizontal Resistance") in FIG. 7B indicates the direction of electrical current, within first contact 722, which is impeded by the horizontal (or sheet) resistance of the first contact 722. The vertical resistance of first contact 722 may be indicated as $R_V$, and the sheet/horizontal resistance of first contact 722 may be indicated as $R_S$. In some embodiments, the one or more other contacts 732 of probe card 720 may also be characterized by corresponding vertical and horizontal (sheet) resistances.

The touchdown event, as shown in FIG. 7C, is initiated via a translation of at least one of the semiconductor device 700 and/or the probe card 720, such that the first contact 722 comes into parallel-contact (e.g., parallel electrical contact) with each of the plurality of anodes, including but not limited to first anode 702, second anode 704, and third anode 706. As shown in FIG. 7C, the probe card 720 is configured and arranged such that when the first contact 722 is in parallel-contact (e.g., parallel electrical contact) with each of the plurality of anodes, the one or more other contacts 732 are in parallel-contact with each of the plurality of cathodes, including but not limited to the first cathode 712 and the second cathode 714. Via the parallel-contact of the first electrode 724 and the one or more other electrodes 734, a voltage difference, may be applied in parallel, to each anode/cathode pair. In some embodiments, each of the first electrode 724 and the one or more of the other electrodes 734 may be planar metallic surfaces. The first electrode 724 may be a continuous and/or common electrode for the first contact 722. More particularly, the voltage difference applied across anode/cathode pairs may be a consequence of applying a supply voltage ($V_s$) to the first contact 722, via first electrode 724, and applying a control voltage ($V_c$) to the one or more other contacts 732 via the one or more other electrodes 734, as shown in FIG. 7C. The vertical arrow, marked as $V_s$ in FIG. 7C, indicates the application of the supply voltage to the first contact 722 via the electrode 724. Likewise, the vertical arrows, marked as $V_C$ in FIG. 7C, indicate the application of the control voltage to the one or more other contacts 732 via the one or more other electrodes 734.

The voltage difference, applied in parallel, may cause the operation of each of the discrete devices (e.g., discrete μLEDs) integrated on the μLED die 700. The operation of each of the discrete devices may generate an output signal from each of the discrete devices. In the case where the discrete devices include μLEDs, each of the output signals may be an optical or light output signal from each of the discrete μLEDs. The output signals may be observed. For instance, a camera, such as but not limited to camera device 740 of FIG. 7C, may be employed to image the light output signals from the discrete μLEDs. Image data, generated by camera device 740 and encoding an image of the light output of each of the discrete μLEDs may be employed to test and/screen the μLED die 700. The screen may be a pass/fail screening, where when the μLED die 700 passes the screening, the μLED die 700 may be labeled as a Known Good Die or Device (e.g., a KGD).

As indicated above, first contact 722 of probe card 720 may include a conformal and/or elastic film or sheet. The first contact 720 may be fabricated from an electrically-conductive elastic material, such as but not limited to conductive polymer. In some embodiments, the polymer of first contact 720 may be a polymer mixture of two or more ionomers. For example, the polymer may include a polymer such as but not limited to poly (3,4-ethylenedioxythiophene) polystyrene sulfonate (PEDOT:PSS) or the like. The polymer film and/or sheet may be applied to the first electrode 724 and may be large enough to electrically contact each of the plurality of anodes (or cathodes) of the μLED die 700, via a touchdown event. The one or more other contacts 732 of probe card 720 may also include a conformal and/or elastic film and/or sheet. The one or more other contacts 732 may include similar properties of electrical resistance and/or elastic/conformal properties of first contact 722.

Because the first contact 722 and/or the one or more other contacts 734 may include a conformal and/or elastic film or sheet, the presence of particles or other debris on the surface of the contact pads for the anodes and/or cathodes will not substantially decrease the first contact's 722 and the one or more other contacts' 732 ability to provide the input signal. For example, in FIGS. 7B-7C, dust particle 718 is present on the upper surface of third anode 706 of the μLED die 700. FIG. 7C shows the elastic deformation 742 of the elastic first contact 722 due to the dust particle 718, such that during the touchdown event, the first contact 722 conforms to the shape dust particle 718, while still making electrical contact with the third anode 706. Also, because the first contact 722 and the one or more other contacts 732 are elastic, the screening measurements are substantially immune to variations in the size, shape, or height of the contact pads for the anodes and/or cathodes of the μLEDs. For instance, FIG. 7C shows additional elastic deformations (e.g., elastic deformation 744 around the shape of the second anode 704), such that the first contact 722 conforms to any variations in the size, shape, or height of the contact pads and/or anodes/cathodes.

Figure 7D:
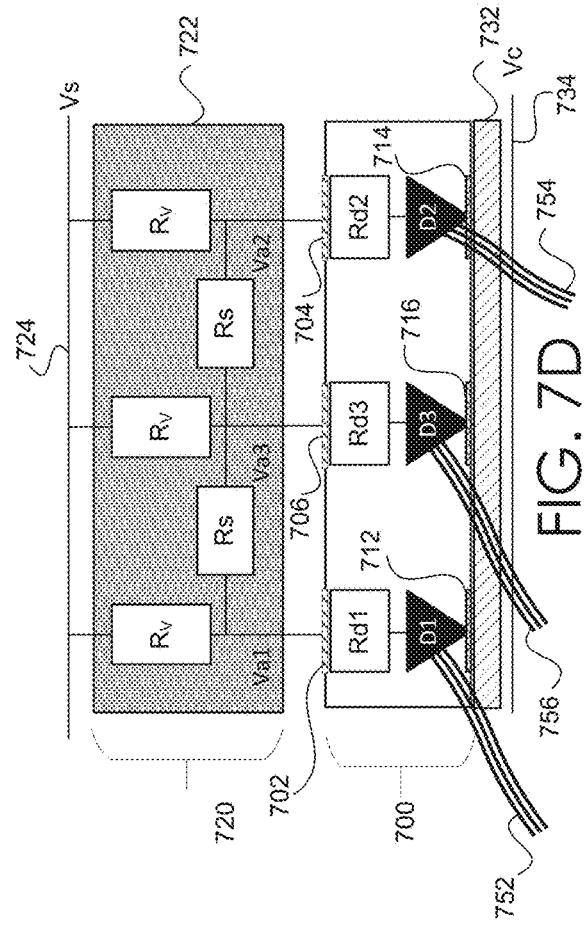
FIG. 7D shows a schematic diagram of the screening circuit created when the probed card of FIGS. 7B-7C is in electrical contact with the semiconductor device of FIG. 7A via a touchdown event, which is consistent with the various embodiments.

FIG. 7D shows a schematic diagram of the screening circuit created when the probed card 720 is in electrical contact with the μLED die 700 via a touchdown event, which is consistent with the various embodiments. As noted above, $R_V$ indicates the vertical resistance of first contact 722, and $R_S$ indicates the horizontal or sheet resistance of first contact 722. First electrode 724 is providing the supply voltage ($V_S$) to the first contact 722, and the one or more other electrodes 732 is providing the control voltage ($V_C$) to the one or more other contacts 734. The first μLED (D1) includes the first anode 702, the corresponding first cathode 712, and a first internal diode resistance Rd1. The second μLED (D2) includes the second anode 704, the corresponding second cathode 714, and a second internal diode resistance Rd2. The third μLED (D3) includes the third anode 706, the corresponding third cathode 716, and a third internal diode resistance Rd3. Note that the values of the vertical resistance ($R_V$) and the sheet resistance ($R_S$) are intrinsic to the first contact 722 of the probe card 720, whereas the values of the internal diode resistances (Rd1, Rd2, and Rd3) are intrinsic to the corresponding first, second and third μLEDs: D1, D2, and D3.

In some embodiments, the operating voltage (e.g., the forward voltage required to generate a desired output of luminosity) of each of the discrete μLEDs on the μLED die 800 is between 1.5 V and 3.5. V. In various embodiments, the "average" operating voltage of the μLEDs is between 3.0 V and 3.5 V to generate the desired amount of light output from the μLEDs. In at least one embodiment, the average operating (or forward) voltage of the μLEDs is approximately 3.3 V. Thus, to operate the first μLED D1, a forward voltage difference of approximately 3.3 V may be applied across the first anode 702 and the first cathode 712. Likewise, to operate the second μLED D2, a forward voltage difference of approximately 3.3 V may be applied across the second anode 704 and the second cathode 714. To operate the third μLED D3, a forward voltage difference of approximately 3.3 V may be applied across the third anode 706 and the third cathode 716. When a sufficient operating voltage difference is applied across the first anode 702 and the first cathode 712, the first μLED D1 may generate a first optical output 752. When a sufficient operating voltage difference is applied across the second anode 704 and the second cathode 714, the second μLED D2 may generate a second optical output 754. When a sufficient operating voltage difference is applied across the third anode 706 and the third cathode 716, the third μLED D3 may generate a third optical output 756.

Due to the vertical resistance of first contact 722, the supply voltage experiences a voltage drop across the vertical height of the first contact, such that a first anode voltage (Va1) is applied to the first anode 702 of the first μLED D1, a second anode voltage (Va2) is applied to the second anode 704 of the second μLED D2, and a third anode voltage (Va3) is applied to the third anode 706 of the third μLED D3, where Va1, Va2, Va3<$V_S$. Thus, a first operating voltage difference of $|Va1-V_C|$ is applied across the first anode 702 and the first cathode 712 of the first μLED D1. As noted above, when the first operating voltage difference ($|Va1-V_C|$) is a sufficient forward voltage (e.g., 3.3 V), the first μLED D1 may emit a first output signal (e.g., first optical output 752). A second operating voltage difference of $|Va2-V_C|$ is applied across the second anode 704 and the second cathode 714 of second μLED D2. When the second operating voltage difference ($|Va2-V_C|$) is a sufficient forward voltage (e.g., 3.3 V), the second μLED D2 may emit a second output signal (e.g., second optical output 754). A third operating voltage difference of $|Va3-V_C|$ is applied across the third anode 706 and the third cathode 716 of third μLED D3. When the third operating voltage difference ($|Va3-V_C|$) is a sufficient forward voltage (e.g., 3.3 V), the third μLED D3 may emit a third output signal (e.g., third optical output 756). The first optical output 752 of first μLED D1, the second optical output 754 of second μLED D2, and the third optical output 756 of third μLED D3 may be imaged via camera device 740 of FIG. 7C.

In some embodiments, each of the vertical resistance and the sheet resistance is significantly larger than the internal diode resistances. In at least one embodiment, $R_V \geq 10 \cdot Rd1$, Rd2, and Rd3. Likewise, in some embodiments, $R_S \geq 10 \cdot Rd1$, Rd2, and Rd3. Thus, regardless of variances in the internal diode resistances (e.g., Rd1, Rd2, and Rd3), the variance in the applied anode voltages (e.g., Va1, Va2, and Va3) is relatively small. In some embodiments, the variances within the applied anode voltages are within +10%, despite larger variances in the internal diode resistances. In some embodiments, the voltage difference between the supply voltage and the control voltage (i.e., $|V_S-V_C|$) is approximately 20 V. In such embodiments, the voltage drop across the vertical height of the first contact 722 may be approximately 16-17

V. Thus, the forward voltage (e.g., |Va1−Vc|) applied across the first anode 1702 and the first cathode 1712 may be between 3-4 V and may cause the operation of the first μLED D1. The forward voltage (e.g., |Va2−Vc|) applied across the second anode 1704 and the second cathode 1714 may be between 3-4 V and may cause the operation of the second μLED D2. The forward voltage (e.g., |Va3−Vc|) applied across the third anode 1706 and the third cathode 1716 may be between 3-4 V and may cause the operation of the third μLED D3.

Although adjacent discrete μLEDs (e.g., first μLED D1, second μLED D2, and first μLED D3) may share from the current source of the first contact 722, due to the relative high vertical and sheet resistance of the first contact 722, the current is not freely-shared in a similar way that other parallel-connected devices are. The vertical and sheet resistance of the first contact 722 at least partially "isolates" each of the three parallel "branches" of the circuit shown in FIG. 7D. For example, in the event where the second μLED D2 includes a short circuit (e.g., Rd2 Rd1, Rd3), the relative high value of $R_S$ significantly decreases the amount of the electric current that would otherwise flow through first μLED D1 and third μLED D2 from flowing into second μLED D2, due to the short circuit in the second μLED D2. Likewise, in the case were the second μLED D2 includes an open circuit (e.g., Rd>>$R_V$, $R_S$), the relative high value of $R_S$ significantly decreases the amount of the electric current that would otherwise flow through second μLED D1 from flowing into first μLED D1 and third μLED D3, due to the open circuit in the second μLED D2. Thus, μLEDs with short or open circuits will not substantially affect the amount of current drawn by neighboring μLEDs. Accordingly, the variance in current drawn by the μLEDs (except those that may include a short or open circuit) will be relatively small (e.g., +10%). Accordingly, the observation of the light output for the μLEDs will be relatively representative of the external quantum efficiency (EQE) of the individual μLEDs.

FIGS. 8A-8C include diagrams illustrating a side view of a μLED die 800 and another embodiment of an enhanced isotropic probe card 820 that is consistent with the various embodiments described herein. In particular, FIG. 8A shows the μLED die 800 and probe card 820 prior to a touchdown event. Thus, FIG. 8A is somewhat analogous to FIG. 7B. FIG. 8B shows the μLED die 800 and probe card 820 after the touchdown event. Thus, FIG. 8B is somewhat analogous to FIG. 7C. FIG. 8C shows the μLED die 800 after the screening and/or testing of the μLED die 800 is complete and the μLED die 800 has been determined to be a Known Good Die (KGD).

μLED die 800 may be similar to μLED die 700 of FIGS. 7A-7D. Thus, μLED die 800 may include a plurality of anodes, such as but not limited to a first anode 802, a second anode 804, and a third anode 806, where each of the plurality of anodes is located within a first portion 808 of μLED die 800. Likewise, μLED die 800 may include a plurality of cathodes, such as but not limited to a first cathode 812 and a second cathode 814, where each of the plurality of cathodes is located within a second portion 810 of μLED die 800. In other embodiments of μLED die 800, each of the plurality of cathodes is located within the first portion 810 of the μLED die 800 and each of the plurality of anodes is located within the second portion 808 of the μLED die 800.

Probe card 820 may be somewhat similar to probe card 820 of FIGS. 7B-7D in that probe card 820 includes a first electrode 824 and one or more other electrodes 834. First electrode 824 of probe card 820 may be similar to first electrode 724 of probe card 720 and the one or more other electrodes 834 of probe card 820 may be similar to the one or more other electrodes of probe card 720. In contrast to probe card 720, the elastic/conformal and electrically-conductive film/sheet that provides electrical contact between the first electrode 724 and each of the plurality of anodes (or alternatively the plurality of cathodes) is applied directly on the top surface of the μLED die 800.

As shown in FIG. 8A and in contract to probe card 720, prior to screening and/or testing the μLED die 800, first contact 822 may be applied directly to the top surface of the first portion 808 of the μLED die 800, rather than to the surface of first electrode 824. Also in contrast to probe card 720, prior to screening and/or testing the μLED die 800, one or more other contacts 832 may be applied directly to the top surface of the second portion 810 of the μLED die 800, rather than to the surface of the one or more other electrodes 834. As shown in FIG. 8A, once applied to the top surface of the first portion 808 of the μLED die 800, the first contact 822 makes parallel-contact with each of the plurality of anodes (or alternatively each of the plurality of cathodes), including but not limited to first anode 802, second anode 804, and the third anode 806. Likewise, once applied to the top surface of the second portion 810 of the μLED die 800, the one or more other contacts 832 make parallel-contact with each of the plurality of cathodes (or alternatively each of the plurality of anodes), including but not limited to first cathode 812 and the second cathode 814. First contact 822 may be similar to first contact 722 of probe card 720. Likewise, the one or more other contacts 834 may be similar to the one or more other contacts 734. Accordingly, first contact 822 and/or the one or more other contacts 834 may include an electrically-conductive but elastic and/or conformal film and/or sheet. The electrical-conductivity of the first contact 822 and the one or more other contacts 834 may be isotropic with respect to the vertical and horizontal directions. As noted above, FIG. 8A shows the μLED die 800 and probe card 820 prior to a touchdown event.

Turning attention to FIG. 8B, FIG. 8B shows the μLED die 800 and probe card 820 after the touchdown event. That is, a touchdown event provides a transition from FIG. 8A to FIG. 8B. The touchdown event includes a translation of at least one of semiconductor device 800 and/or probe card 820, such that a first electrode 824 of the probe card 820 makes electrical-contact with the first contact 822 and the one or more other electrodes 834 of the probe card 820 makes electrical-contact with the one or more other contacts 832. Because the first electrode 832 is in electrical-contact with the first contact 822, and because the first contact 822 is electrically-conductive and is in parallel-contact with each of the plurality of anodes, the first electrode 832 is in parallel-contact with each of the plurality of anodes. Likewise, because the one or more other electrodes 834 are in electrical-contact with the one or more other contacts 832, and because the one or more other contacts 834 are electrically-conductive and are in parallel-contact with each of the plurality of cathodes, the one or more other electrodes 834 are in parallel-contact with each of the plurality of cathodes. Similar to FIG. 7C, FIG. 8B shows the application of the supply voltage to the plurality of anodes (via the first electrode 824 and the first contact 822), and the application of the control voltage to the plurality of cathodes (via the one or more other electrodes 834 and the one or more other contacts 832). Thus, FIG. 8B shows the simultaneous testing and/or screening of each of the discrete μLEDs integrated on the μLED die 800.

After the testing and/or screening of the μLED die, the first contact 822 and the one or more other contacts 832 may be removed from the μLED die 800. FIG. 8C shows the tested and/or screened μLED die 800 after each of the first contact 822 and the one or more other contacts 832 have been removed from the μLED die 800.

Enhanced Anisotropic Probe Cards

FIGS. 9A-9B include diagrams illustrating a side view of the integrated semiconductor device 900 and an anisotropic enhanced probe card 920 that is consistent with the various embodiments. Anisotropic probe card 920 may be employed to simultaneously operate, test, and/or screen each of the discrete semiconductor devices (e.g., individual μLEDs). Accordingly, probe card 920 may be employed to operate, test, and/or screen semiconductor device 900 via a single touchdown event. When probing the semiconductor device 900 and in addition to operating each of the discrete semiconductor devices, anisotropic probe card 920 may individually address each of the discrete semiconductor devices, as well as observe, sense, and/or measure the electrical current drawn from each of the discrete semiconductor devices. Thus, anisotropic probe card 920 may be employed to separately operate each of the discrete devices by providing each of the discrete semiconductor devices a separate operating signal (e.g., apply an operating voltage), as well as perform current-voltage (e.g., IV) characterizations of each of the discrete semiconductor devices integrated on semiconductor device 900.

FIG. 9A shows semiconductor device 900 and the probe card 920 before the touchdown event, whereas FIG. 9B shows the semiconductor device 900 and the probe card 920 after the touchdown event. Thus, FIG. 9A is somewhat analogous to FIG. 7B and FIG. 9B is somewhat analogous to FIG. 7C. As discussed below, the touchdown event includes a translation of at least one of semiconductor device 900 and/or probe card 920, such that a first contact 922 of the probe card 920 makes parallel-contact with the contact pads for each of the plurality of anodes (or alternatively the cathodes) of the discrete semiconductor devices integrated on semiconductor device 900 and one or more other contacts 932/934 of the probe card 920 makes parallel-contact with each of the cathodes (or alternatively the anodes) of the discrete semiconductor devices integrated on semiconductor device 900. After the touchdown event, and as shown in FIG. 9B, the probe card 920 may be in electrical contact with the contact pads for each of the plurality of anodes and each of the plurality of cathodes. Thus, probe card 920 may operate each of the discrete semiconductor devices integrated on the semiconductor device 900 providing an operating signal (e.g., providing a voltage difference across the anode and corresponding cathode) to each discrete semiconductor device.

Semiconductor device 900 may be similar to semiconductor device 700 of FIGS. 7A-7D. Thus, as discussed in conjunction with FIG. 7A, semiconductor device 900 may be a μLED die that includes a plurality (>$10^6$) of integrated μLEDs. In the side view of FIGS. 9A-9B, and for purposes of clarity, only a small fraction of the plurality of anodes (and corresponding contact pads) of μLED die 900 and only a small fraction of the plurality of cathodes (and corresponding contact pads) of μLED die 900 are shown. For example, as shown in the side view of FIG. 9A, μLED die 900 includes the first anode 902, the second anode 904, and the third anode 906, in the first portion 908 of the μLED die 900. Likewise, as shown in the side view of FIG. 9A, μLED die 900 includes first cathode 912 (which corresponds to first anode 902) and second cathode 914 (which corresponds to second anode 904), in the second portion 910 of the μLED die 900. The corresponding contact pads for the first anode 902, the second anode 904, the third anode 906, the first cathode 912, and the second cathode 914 are shown with vertical profiles that extend above the top surface of the μLED die 900.

Probe card 920 may include an electrical-conductive first contact 922. The first contact 922 may include an electrically-conductive conformal and/or elastic film or sheet. As discussed below, the electrical conductivity of the first contact 922 may be anisotropic. Enhanced probe card 920 may be immune to the presence of particles (e.g., dust particles) on the plurality of cathodes and anodes. Thus, FIGS. 9A-9B show a dust particle 918 on the surface of the contact pad for third anode 906. The presence of particles (e.g., dust particle 918) or other debris on the surface of the contact pads for the anodes and/or cathodes of the μLED die 900 should not substantially decrease the first contact's 922 ability to provide the input signal (e.g., an operating voltage difference) to the plurality of anodes and cathodes (e.g., when the particle is smaller than contact pad). For example, in FIGS. 9A-9B, dust particle 918 is present on the upper surface of third anode 906 of the μLED die 900. FIG. 9B shows the elastic deformation 982 of the elastic first contact 922 due to the dust particle 918, such that during the touchdown event of FIG. 9B, the first contact 922 conforms to the shape dust particle 918, while still making electrical contact with the third anode 906. Also, because the first contact 922 is elastic, the screening measurements are substantially immune to variations in the size, shape, or height of the contact pads for the anodes and/or cathodes of the μLEDs. For instance, FIG. 9B shows additional elastic deformations (e.g., elastic deformation 984 around the shape of the second anode 904), such that the first contact 922 conforms to any variations in the size, shape, or height of the contact pads and/or anodes/cathodes.

The electrical-conductivity of first contact 922 may be anisotropic with respect to the vertical and horizontal directions. That is, the vertical resistance of the first contact 922 may be non-zero, but finite. The horizontal (or sheet) resistance of the first contact 922 may be large enough that, for practical considerations, may be considered infinite such that very little, if any, electrical current flows in the horizontal direction of the first contact 922 and/or the one or more other contacts 932. Accordingly, in anisotropic first contact 922, electrical current is constrained to be primarily in the vertical direction, with very little if any, electrical current flowing in the horizontal direction of first contact 922. As noted above, the first contact 922 may be fabricated from a polymer or another elastic/conformal material. In some embodiments, the vertically-oriented anisotropic conductivity (or resistance) may be achieved via a polymer matrix in first contact 922, with vertically aligned conductive nanowires and/or nanotubes. In some non-limiting embodiments, the polymer matrix may include a polymer such as but not limited to polymide (PI), polydimethylsiloxane (PDMS), polyurethane (PU), or the like. The conductive nanowires and/or nanotubes may include and/or be fabricated from carbon nanotubes (CNTs), dopes silicon nanowires (SiNW), silicon (Si), metals, or other such conductive nanoparticles, nanowires, and/or nanotubes.

In contrast to common electrode 724 of isotropic probe card 720 of FIGS. 7B-7D, anisotropic probe card 920 may include a separate anode electrode for each of the plurality of anodes of the μLED die 900 and a separate anode electrode for each of the plurality of cathodes of the μLED die 900. For example, probe card 920 includes a first anode electrode 942, which corresponds to first anode 902 of μLED die 900, a second anode electrode 944, which corresponds to second anode 904 of μLED die 900, and a third anode electrode 946, which corresponds to third anode 906 of μLED die 900. Likewise, probe card 920 includes a first cathode electrode 932, which corresponds to first cathode 912 of μLED die 900, and a second cathode electrode 934, which corresponds to second cathode 914 of μLED die 900.

Anisotropic probe card 920 includes a common backplane 924, where the plurality of anode/cathode electrodes are disposed intermediate the common backplane 924 and the first contact 922. For each of the plurality of anodes of the μLED die 900 and a separate anode electrode for each of the plurality of cathodes of the μLED die 900, the common backplane 924 may include an address line, such that each of the plurality of cathodes and each of the plurality of anodes may be addressed. The common backplane 924 may include a significant electrical-resistance (or low electrical conductivity), such that each of the plurality address lines (e.g., address lines 952, 954, 962, 964, and 966) are electrically-isolated from one another.

Although the common backplane 924 is substantially non-conductive, each of the address lines are in electrically contact with the corresponding anode electrode or cathode electrode. For example, first anode address line 962 is in electrical contact with first anode electrode 942, but electrically isolated from each of the other anode/cathode address lines and each of the other anode/cathode electrodes. Second anode address line 964 is in electrical contact with second anode electrode 944, but electrically isolated from each of the other anode/cathode address lines and each of the other anode/cathode electrodes. Third anode address line 966 is in electrical contact with second anode electrode 946, but electrically isolated from each of the other anode/cathode address lines and each of the other anode/cathode electrodes. First cathode address line 952 is in electrical contact with first cathode electrode 932, but electrically isolated from each of the other anode/cathode address lines and each of the other anode/cathode electrodes. Second cathode address line 954 is in electrical contact with second cathode electrode 934, but electrically isolated from each of the other anode/cathode address lines and each of the other anode/cathode electrodes.

Upon the touchdown event shown in FIG. 9B, first anode address line 962 is in electrical contact with first anode 902 of the μLED die 900, second anode address line 964 is in electrical contact with second anode 904 of the μLED die 900, and third anode address line 966 is in electrical contact with third anode 906 of the μLED die 900. The first cathode address line 952 is in electrical contact with first cathode 912 of the μLED die 900 and the second cathode address line 954 is in electrical contact with second cathode 914 of the μLED die 900. Thus, after the touchdown event, each anode/cathode address line of the anisotropic probe card 920 may be employed to apply a voltage to the corresponding anode/cathode of the μLED die 900.

As noted above, each of the address lines may be employed to address (e.g., apply a voltage to) the corresponding anode/cathode electrode. For example, first anode address line 962 (embedded in or on non-conductive common backplane 924) may be employed to address first anode electrode 942. As shown in FIG. 9B, after the touchdown event, first anode address line 962 may be employed to address first anode 902 of the μLED die 900. Second anode address line 964 may be employed to address second anode electrode 944. After the touchdown event, second anode address line 964 may be employed to address second anode 904 of the μLED die 900. Third anode address line 966 may be employed to address third anode electrode 946. After the touchdown event of FIG. 9B, third anode address line 966 may be employed to address second anode 906 of the μLED die 900. First cathode address line 952 may be employed to address first cathode electrode 932. After the touchdown event, first cathode address line 952 may be employed to address first cathode 912 of the μLED die 900. Second cathode address line 954 may be employed to address second cathode electrode 934. After the touchdown event, second cathode address line 954 may be employed to address second cathode 914 of the μLED die 900.

At least a portion of the anode and/or cathode address lines may include a current sense circuit (e.g., a sense amplifier), in order to sense, detect, measure, and/or observe the electrical current flowing through the address line (and thus the corresponding discrete μLED of the μLED die 900). For example, first anode address line 962 may include first sense circuit 982, which may sense the electrical current flowing through first anode address line 962. Thus, first sense circuit 982 may be employed to sense the electrical current flowing through the first diode, via the first anode 902 and the first cathode 912. Second anode address line 964 may include second sense circuit 984, which may sense the electrical current flowing through second anode address line 964. Thus, second sense circuit 984 may be employed to sense the electrical current flowing through the second diode, via the second anode 904 and the first cathode 914. Third anode address line 966 may include third sense circuit 986, which may sense the electrical current flowing through third anode address line 966. In some embodiments, the cathode address lines 952/954 may include electrical sense circuits.

Via the address lines and the sense circuits, current-voltage (IV) characterizations and/or measurements may be made for each of the discrete μLEDs of the μLED die 900. Camera device 940 may be employed to image the light output of each of the discrete μLEDs. Note that in contrast to probe card 720 of FIGS. 7B-7C, and because of the anisotropic conductivity of the first contact 922 (e.g., the electrical current in first contact 922 is primarily in the vertical direction, and little if any electrical current flows in the horizontal directions), adjacent discrete μLEDs of the μLED die 900 will not share electrical current.

Enhanced Processes for Testing and/or Screening Semiconductor Devices

Figure 10:
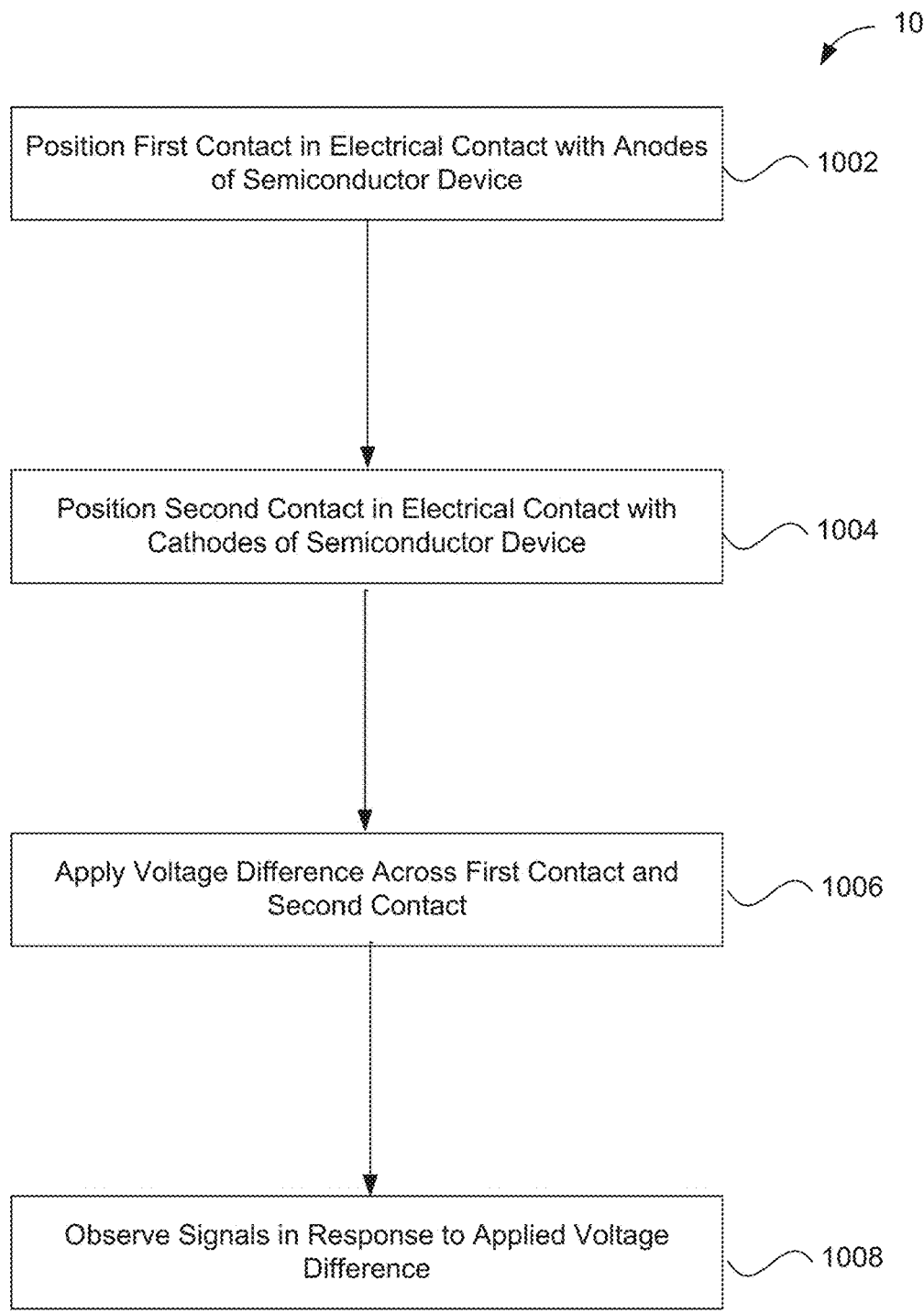
FIG. 10 illustrates one embodiment of an enhanced process flow for testing and/or screening a semiconductor device.

FIG. 10 illustrates one embodiment of an enhanced process 1000 flow for testing and/or screening a semiconductor device. Processes 1000 may be employed to test the electrical and/or optical properties of semiconductor device (i.e., a DUT). In some non-limiting embodiments, the DUT (a semiconductor device) may be a light-emitting component (LEC), such as but not limited to a light-emitting diode (LED). In at least one embodiment, the LED may be a micro-LED (μLED). In other embodiments, the semiconductor device need not be a light-emitting device. For example, the semiconductor device may include a transistor, a non light-emitting diode, a resistive element, a capacitor, a microelectricalmechanical (MEMs) device, and the like. In some embodiments, the semiconductor device may include a logic device (e.g., a processors and/or an array of logic gates), a memory device (e.g., a SRAM, DRAM, and/or EEPROM), or any other integrated circuit (IC) device. The DUT may include, or at least be similar to μLED die 700 of FIGS. 7A-7C, μLED die 800 of FIGS. 8A-8B, and/or μLED die 900 of FIGS. 9A-9B.

In embodiments where the DUT includes one or more μLEDs (e.g., μLED die 700/800/900), the μLEDs may be included in any of the embodiments of head-mounted devices (HMDs) and/or near-eye display (NEDs) discussed herein. For example, a tested μLED may be included in a virtual-reality (VR) device, an augmented-reality (AR) device, and/or a mixed-reality (MR) device. The various operations, blocks, actions, and/or steps of process 1000 may be implemented via executing instructions on a processor device and/or controller device. When the instructions are executed, the processor device and/or controller device may cause the performance the various operations, blocks, actions, and/or steps of process 1000. The instructions may be stored on a non-transitory computer-readable storage medium and/or media.

As used herein, computer-readable storage media and/or medium can be any available media that can be accessed by a computing device and includes both volatile and nonvolatile media, and removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computing device. Non-transitory computer-readable storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Turning to FIG. 10, process 1000 begins at block 1002, where a testing device (e.g., an enhanced probe card) is positioned proximate to the DUT. For example, the DUT may be integrated semiconductor device (e.g., a μLED die) that includes a plurality discrete semiconductor device (e.g., μLEDs). The DUT may include a plurality of anodes a plurality of cathodes, with exposed contact pads. The plurality of cathodes (or alternatively the anodes) may be arranged around a perimeter of the DUT. The plurality of anodes (or alternatively the cathodes) may be arranged in a one-dimensional (1D) or a two-dimensional (2D) array that is surrounded by the plurality of cathodes (or alternatively the anodes). A pitch between adjacent anodes (and/or adjacent cathodes) of the plurality of anodes (and/or the cathodes) may be between a half a micron and four microns. The DUT may be intended to be included in a display device of a head-mounted device comprising a virtual-reality device, an augmented-reality device, or a mixed-reality device.

The testing device may be an isotropic probe card or an anisotropic probe card. Thus, the probe card may include an electrically-conductive first contact and one or more electrically-conductive other contacts (e.g., a second contact). More specifically, at block 102, at least one of the probe card and/or the semiconductor device may be translated such that the first contact of the probe card is positioned such that the first contact is in parallel-contact with each of the plurality of anodes (or alternatively the cathodes) of the semiconductor device. At block 1004, the one or more other contacts (e.g., a second contact of the probe card) may be positioned such that the one or more other contacts is in parallel-contact with each of the plurality of cathodes (or alternatively the anodes) of the semiconductor device. That is, at blocks 1002 and 1004, a "touchdown" event between the DUT and the probe card may be performed.

The first contact of the probe card may be comprised of an elastic material such that when the first contact is in parallel-contact with each of the plurality of anodes, a shape of a surface of the first contact conform to a shape of a surface of each of the plurality of anodes. The first contact (and the one or more other contacts may include a conformal film and/or sheet that is electrically conductive and coats at least a portion of a surface. The first contact may include an electrically-conductive polymer film and/or sheet with a thickness that is less than seven microns. In some embodiments, the electrical resistance of the first contact (and/or the one or more other contacts) may be substantially isotropic with respect to the horizontal and vertical directions. In other embodiments, the electrical resistance of the first contact (and/or the one or more other contacts) may be substantially anisotropic).

In some embodiments, the surface may be a top surface of the DUT, while in other embodiments the surface may be a planar surface of the probe card. In various isotropic embodiments, the planar surface may be electrically-conductive common electrode of the probe card, while in some anisotropic embodiments, the planar surface may be a non-conductive backplane of the probe card. In some isotropic embodiments, the conformal film may be characterized by a non-zero and finite vertical resistance and a non-zero and finite sheet (or horizontal) resistance. The sheet resistance of the first contact may significantly decrease the electrical-current sharing between adjacent discrete semiconductor devices of the plurality of semiconductor devices.

At block 1006, a voltage difference may be applied across the first contact and the one or more other contacts (e.g., the second contact). In some embodiments, the voltage difference may be a parallel voltage. When the parallel voltage is applied to the plurality of semiconductor devices, open-circuit and short-circuit devices of the plurality of semiconductor devices may be effectively electrically-isolated from other devices of the plurality of semiconductor devices. The vertical resistance of the first contact and the parallel voltage may be such that when the parallel voltage is applied across the plurality of semiconductor devices, a variance in the parallel voltage applied across the plurality of semiconductor devices may be less than an order of magnitude of the parallel voltage applied across first contact and the one or more other contacts. The parallel voltage applied across the first contact and the one or more other contacts may be between 17 and 30 volts. An operating voltage of each of the plurality of semiconductor devices (e.g., discrete μLEDs) may be between 2.3 and 3.5 volts.

In some anisotropic embodiments, the conformal film being may be characterized by a non-zero and finite vertical resistance and a sheet resistance that may be considered, for all practical purposes, as an infinite resistance. The plurality of discrete semiconductor devices (e.g., individual μLEDs integrated on the DUT) may be characterized by an average internal resistance. Each of the vertical resistance and the sheet resistance of the first contact may be at least an order of magnitude greater than the average internal resistance of the plurality of semiconductor devices.

At block 1008, output signals from the discrete μLEDs (which are in response to the applied voltage different) may be observed. The signals may be employed to screen and/or test the DUT. In some embodiments, the signals may be employed to characterize a process of a semiconductor foundry that fabricated the DUT. Each of the signals may include an optical output from a corresponding discrete μLED. Observing the signals may include capturing an image of the optical output of each of the plurality of semiconductor devices. The image of the optical output of each of the plurality of semiconductor devices may be employed to determine a relative external quantum efficiency of each of the plurality of discrete μLEDs.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A non-transitory computer-readable storage medium having instructions stored thereon that when executed by a processor of a computing device, the computing device perform actions comprising:
    positioning an electrically-conductive first contact comprising a film that is at least one of conformal and elastic and characterized by a horizontal electrical resistance and a vertical electrical resistance such that the first contact is in parallel-contact with each of a plurality of anodes on a semiconductor die having a plurality of semiconductor devices, wherein each of the plurality of semiconductor devices includes an anode of the plurality of anodes and a corresponding cathode of a plurality of cathodes on the semiconductor die;
    positioning one or more electrically-conductive other contacts such that the one or more other contacts is in parallel-contact with each of the plurality of cathodes;
    applying a parallel voltage across the first contact and the one or more other contacts; and
    observing a plurality of signals, wherein each of the plurality of signals is generated by a corresponding semiconductor device of the plurality of semiconductor devices and is in response to the applied parallel voltage.

2. The computer-readable storage medium of claim 1, wherein the first contact is comprised of an electrically-conductive polymer film with a thickness that is less than seven microns.

3. The computer-readable storage medium of claim 1, wherein the parallel voltage applied across the first contact and the one or more other contacts is between 17 and 30 volts and an operating voltage of each of the plurality of semiconductor devices is between 2.3 and 3.5 volts.

4. The computer-readable storage medium of claim 1, wherein a pitch between adjacent anodes of the plurality of anodes is between a half a micron and four microns.

5. The computer-readable storage medium of claim 1, wherein each of the plurality of signals includes an optical output from the corresponding semiconductor device and the actions further comprise:
    capturing an image of the optical output of each of the plurality of semiconductor devices; and
    employing the image of the optical output of each of the plurality of semiconductor devices to determine a relative external quantum efficiency of each of the plurality of semiconductor devices.

6. A system comprising:
    an electrically-conductive first contact;
    one or more electrically-conductive other contacts;
    a processor device; and
    a computer-readable storage medium, coupled with the processor device, having instructions stored thereon, which, when executed by the processor device, perform actions comprising:
        positioning the electrically-conductive first contact comprising a film that is at least one of conformal and elastic and characterized by a horizontal electrical resistance and a vertical electrical resistance such that the first contact is in parallel-contact with each of a plurality of anodes on a semiconductor die having a plurality of semiconductor devices, wherein each of the plurality of semiconductor devices includes an anode of the plurality of anodes and a corresponding cathode of a plurality of cathodes on the semiconductor die;
        positioning the one or more electrically-conductive other contacts such that the one or more other contacts is in parallel-contact with each of the plurality of cathodes;
        applying a parallel voltage across the first contact and the one or more other contacts; and
        observing a plurality of signals, wherein each of the plurality of signals is generated by a corresponding semiconductor device of the plurality of semiconductor devices and is in response to the applied parallel voltage.

7. The system of claim 6, wherein an electrical resistance of the first contact is substantially isotropic.

8. The system of claim 6, further comprising:
    a continuous electrode, wherein the first contact covers at least a portion of a surface of the continuous electrode and when the first contact is in parallel-contact with each of the plurality of anodes, the continuous electrode is common to each of the plurality of anodes.

\* \* \* \* \*